US012577979B2

(12) United States Patent (10) Patent No.: US 12,577,979 B2
Caplow-Munro et al. (45) Date of Patent: Mar. 17, 2026

(54) ANTI-LOCK HINGED DEVICE

(71) Applicant: Microsoft Technology Licensing, LLC, Redmond, WA (US)

(72) Inventors: Devin Caplow-Munro, Seattle, WA (US); Denys V. Yaremenko, Carnation, WA (US); Brett A. Tomky, Seattle, WA (US); Daniel C. Park, Woodinville, WA (US); Karsten Aagaard, Monroe, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 101 days.

(21) Appl. No.: 18/382,975

(22) Filed: Oct. 23, 2023

(65) Prior Publication Data

US 2025/0129815 A1    Apr. 24, 2025

(51) Int. Cl.
*F16C 11/04* (2006.01)
*H05K 5/02* (2006.01)

(52) U.S. Cl.
CPC ............ *F16C 11/04* (2013.01); *H05K 5/0226* (2013.01)

(58) Field of Classification Search
CPC .......... A61K 2039/505; A61K 2300/00; A61K 31/4192; A61K 31/4375; A61K 31/496; A61K 31/5377; A61K 31/675; A61K 39/3955; A61K 39/39558; A61P 35/00; C07K 16/2818; F16C 11/04; G06F 1/1652; G06F 1/1681; H04M 1/0268; H04M 1/0206–0229; H05K 5/0226
See application file for complete search history.

(56) References Cited

U.S. PATENT DOCUMENTS

| | | | |
|---|---|---|---|
| 2018/0129253 A1 | 5/2018 | Siddiqui | |
| 2018/0335808 A1* | 11/2018 | Tomky | G06F 1/1626 |
| 2019/0011957 A1* | 1/2019 | Wendt | F16M 13/005 |
| 2019/0086965 A1* | 3/2019 | Kuramochi | G06F 1/1652 |
| 2019/0196541 A1* | 6/2019 | O'Neil | G06F 1/1652 |
| 2020/0267859 A1 | 8/2020 | Kim et al. | |
| 2020/0281085 A1* | 9/2020 | Jia | H04M 1/02 |
| 2020/0409429 A1 | 12/2020 | Hsu | |
| 2022/0187876 A1* | 6/2022 | Feng | G06F 1/1681 |

(Continued)

FOREIGN PATENT DOCUMENTS

| | | | | |
|---|---|---|---|---|
| CN | 111277688 A | * | 6/2020 | H04M 1/0216 |
| CN | 111327739 A | * | 6/2020 | G06F 1/1616 |

(Continued)

*Primary Examiner* — Kenneth Bukowski
(74) *Attorney, Agent, or Firm* — Rainier Patents, P.S.

(57) ABSTRACT

The description relates to hinged devices. One example can include a spine defining inner and outer arced surfaces and a hinge arm positioned between the inner and outer arced surfaces and configured to arcuately move from a retracted position to a fully extended position. The example includes an anti-lock link captured between the spine and the hinge arm to move along an arc. Rotation of the hinge arm to the fully extended position is configured to rotate the anti-lock link along the arc and partially out of the spine until the anti-lock link contacts the spine and blocks further extension of the hinge arm. Reverse rotation of the hinge arm from the fully extended position toward the retracted position is configured to initially cause the hinge arm to contact the anti-lock link and not the outer arced surface.

20 Claims, 20 Drawing Sheets

(56) References Cited

U.S. PATENT DOCUMENTS

| | | | | |
|---|---|---|---|---|
| 2022/0303371 A1* | 9/2022 | Liao | .................... | H04M 1/0216 |
| 2025/0085748 A1* | 3/2025 | Liu | ....................... | G06F 1/1652 |
| 2025/0133152 A1* | 4/2025 | Liao | ..................... | G06F 1/1652 |

FOREIGN PATENT DOCUMENTS

| | | | |
|---|---|---|---|
| CN | 211702086 U | * | 10/2020 |
| WO | 2022268126 A1 | | 12/2022 |
| WO | 2023065730 A1 | | 4/2023 |

* cited by examiner

Device 100

Flexible display 108

First portion 102

First major surface 110

Hinge assembly 106

First major surface 112

Second major surface 114

Second major surface 116

Second portion 104

Hinge arm 124(1)

Hinge assembly 106

Inner spine 120

Hinge arm 124(2)

Spine 118

Spine cover 122

Inner spine 120

Hinge assembly 106

Inner arced surface 128(1)

Inner arced surface 128(2)

Hinge arm 124(1)

P E 132(1)

P E 132(2)

Hinge arm 124(2)

Distal surface 152(1)

Proximal surface 148(1)

Anti-lock link 126(1)

Constraining feature 142(1)

Anti-lock link 126(2)

Constraining surface 146(1)

Central surface 136(1)
Constraining surface 144(1)

Outer arced surface 130(1)

Central surface 136(2)

Outer arced surface 130(2)

Spine 118

Spine cover 122

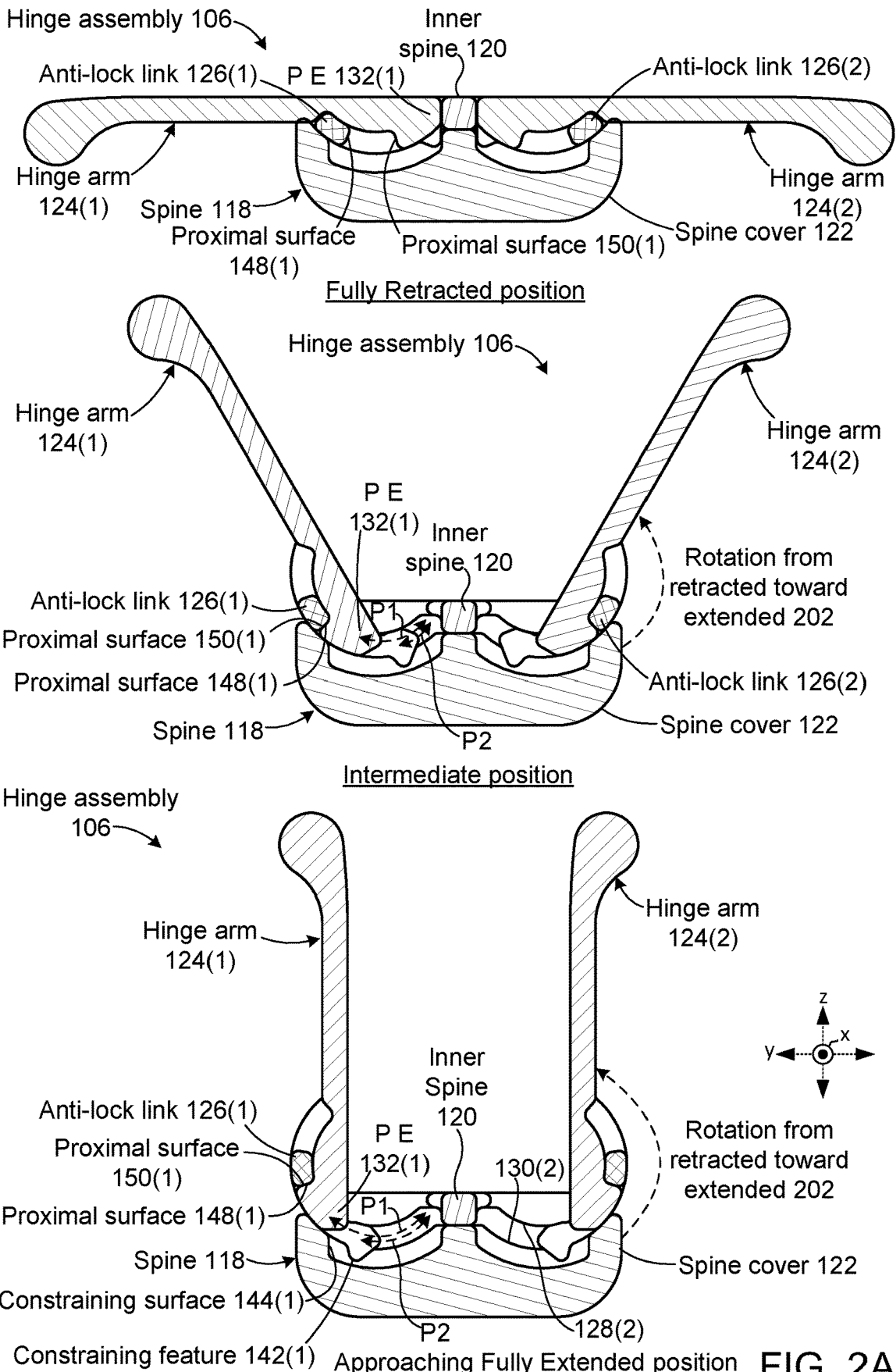

Hinge assembly 106

Anti-lock link 126(1)  P E 132(1)

Inner spine 120

Anti-lock link 126(2)

Hinge arm 124(1)  Spine 118

Proximal surface 148(1)

Proximal surface 150(1)

Spine cover 122

Hinge arm 124(2)

Fully Retracted position

Hinge assembly 106

Hinge arm 124(1)

Hinge arm 124(2)

P E 132(1)  Inner spine 120

Anti-lock link 126(1)

Proximal surface 150(1)

Proximal surface 148(1)

Spine 118

P1

P2

Rotation from retracted toward extended 202

Anti-lock link 126(2)

Spine cover 122

Intermediate position

Hinge assembly 106

Hinge arm 124(1)

Hinge arm 124(2)

Inner Spine 120

Anti-lock link 126(1)

Proximal surface 150(1)

Proximal surface 148(1)

Spine 118

Constraining surface 144(1)

Constraining feature 142(1)

P E 132(1)  130(2)

P1

P2

128(2)

Rotation from retracted toward extended 202

Spine cover 122

Approaching Fully Extended position

FIG. 2A

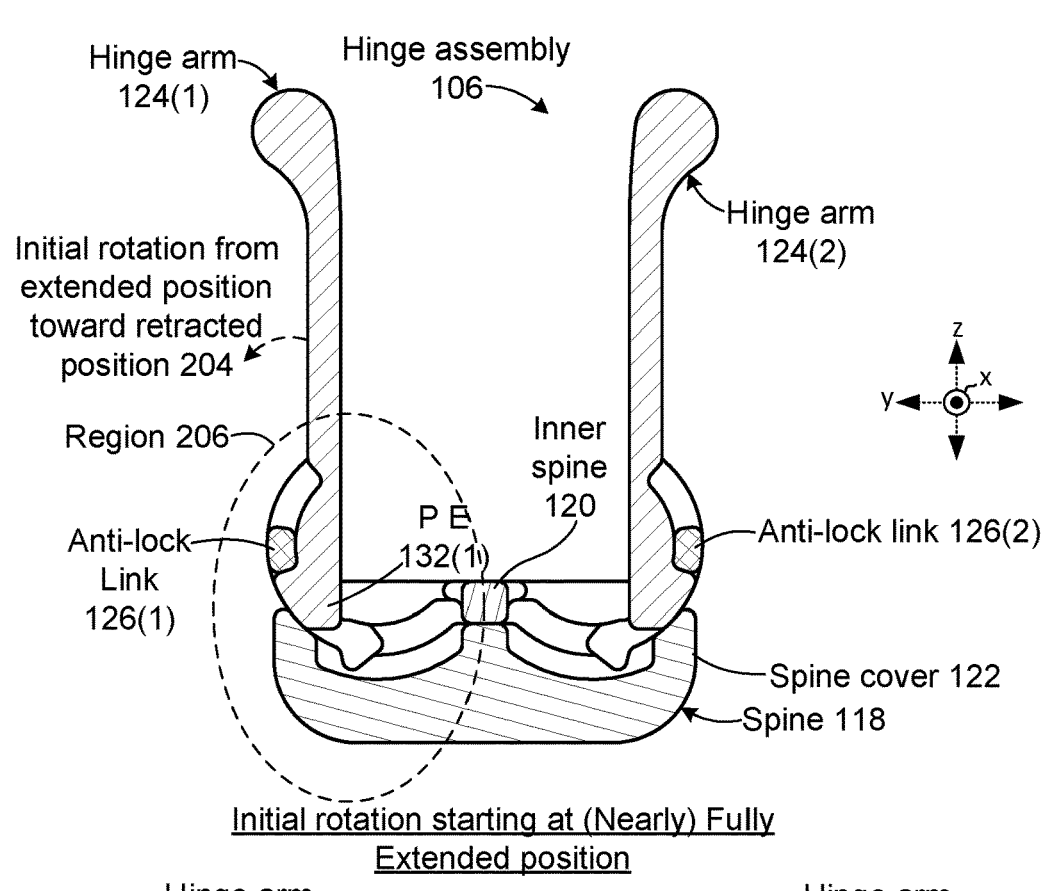
Initial rotation starting at (Nearly) Fully Extended position
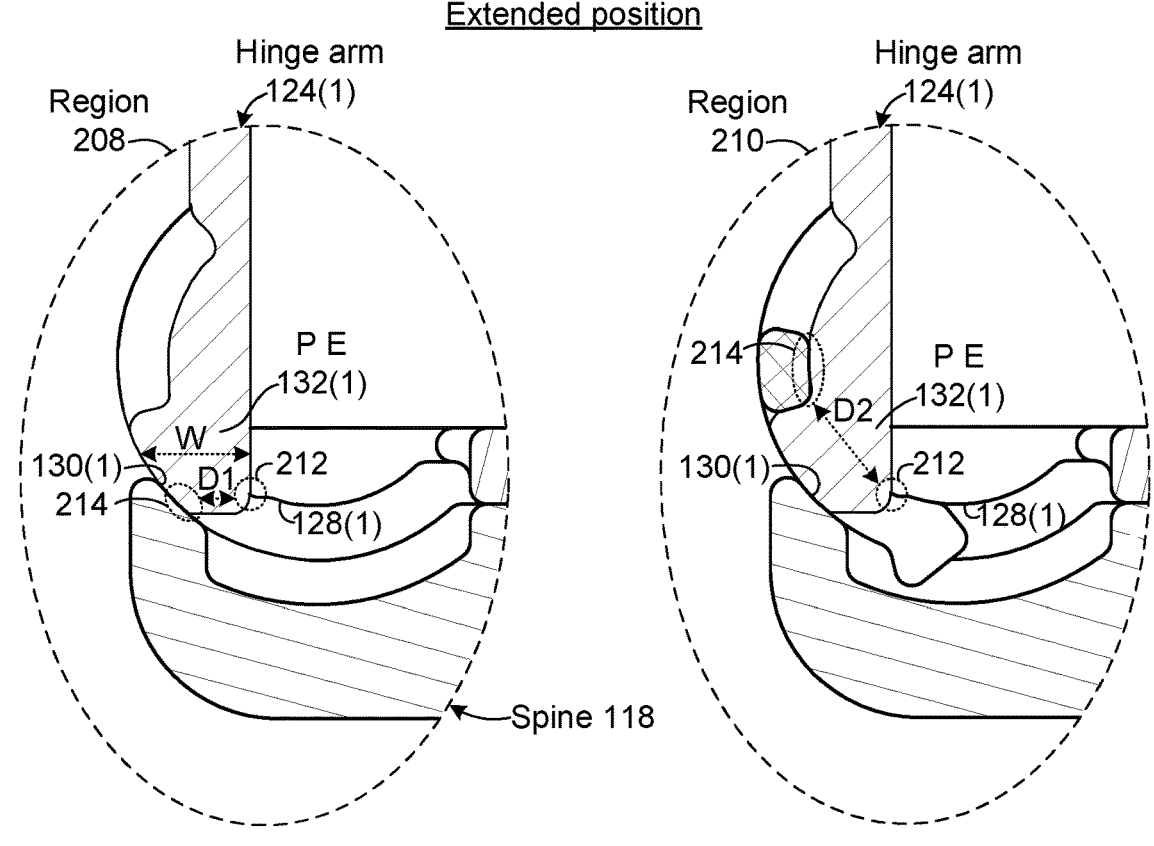
Points of contact without Anti-lock Link     Points of contact with Anti-lock Link
FIG. 2B

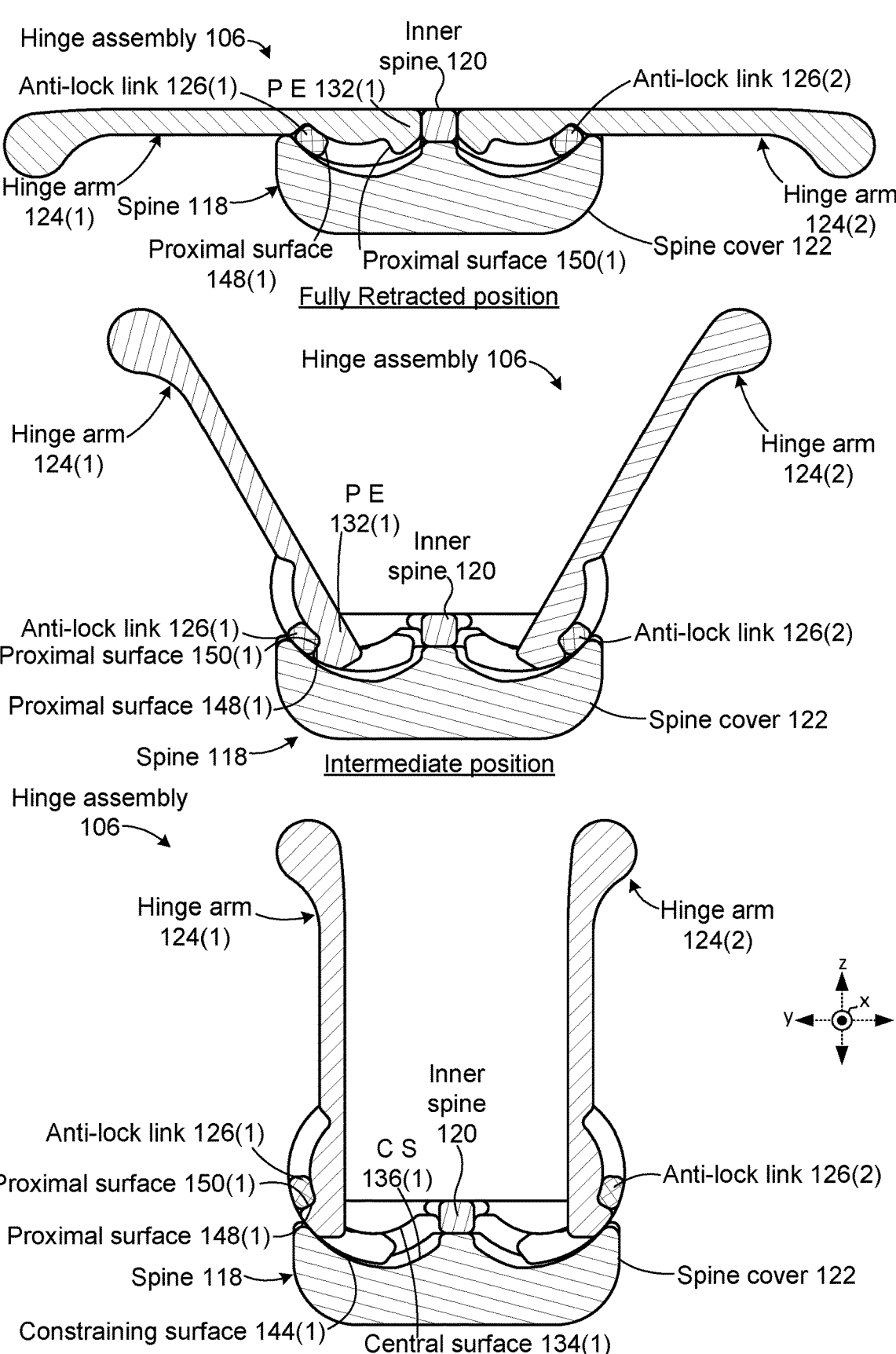
FIG. 5     Approaching Fully Extended position

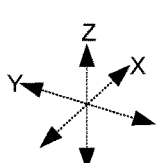
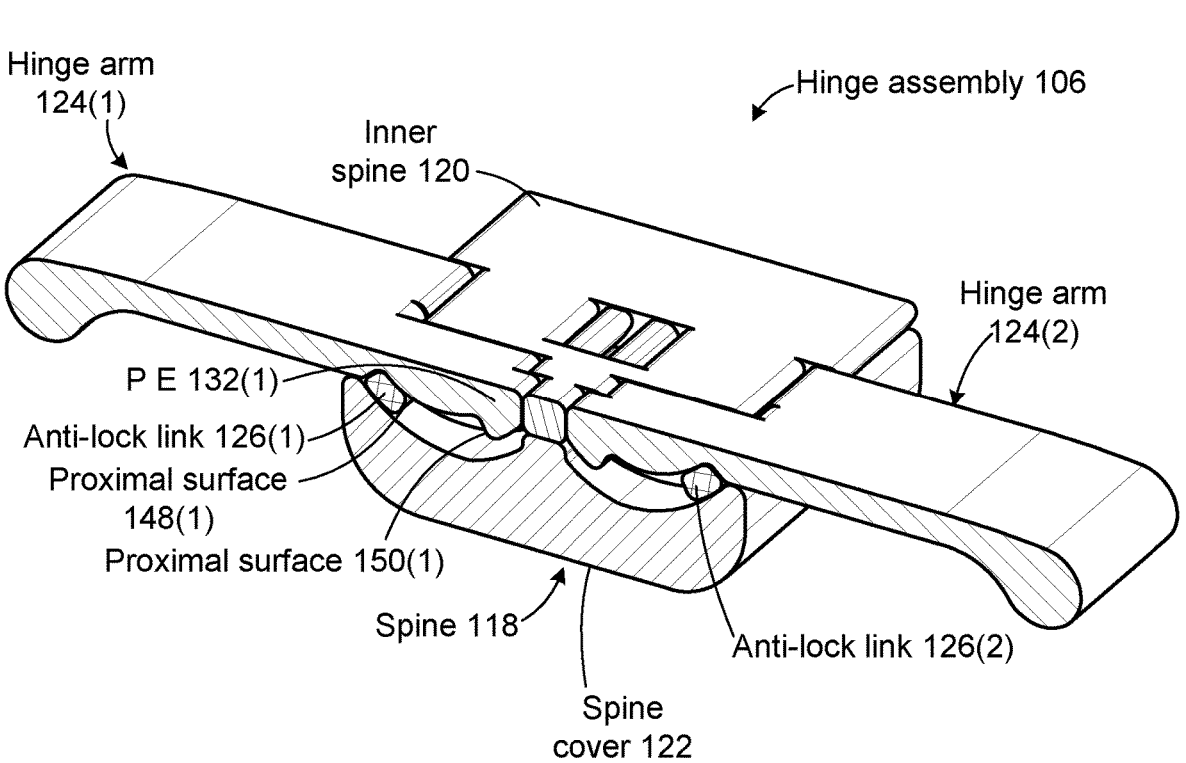
FIG. 6A

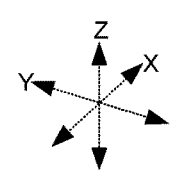
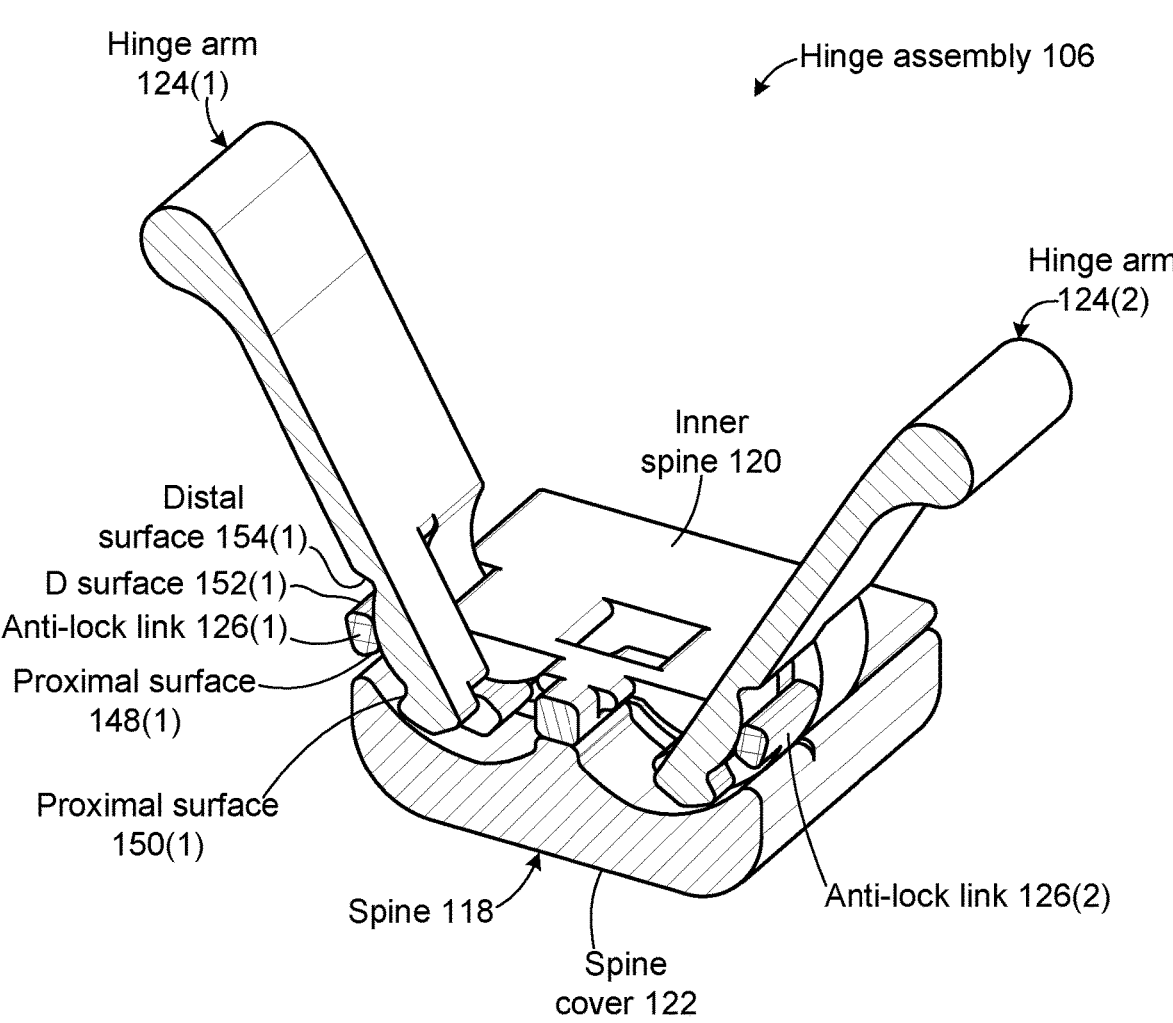
FIG. 6D

ANTI-LOCK HINGED DEVICE

BACKGROUND

Various hinge designs have been employed on computing devices. However, the hinge designs have been very application specific. For instance, one hinge type is employed for a device with a flexible display and another hinge type is employed for a kickstand.

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. Further, the left-most numeral of each reference number conveys the figure and associated discussion where the reference number is first introduced. Where space permits, elements and their associated reference numbers are both shown on the drawing page for the reader's convenience. Otherwise, only the reference numbers are shown.

FIGS. 3A-3E and 6A-6F show cutaway perspective views of example devices in accordance with some implementations of the present concepts.

FIGS. 2A, 2B, and 5 show sectional views of example devices in accordance with some implementations of the present concepts.

SUMMARY

This patent relates to hinged devices. One example can include a spine defining inner and outer arced surfaces and a hinge arm positioned between the inner and outer arced surfaces. The hinge arm can be configured to arcuately move from a retracted position to a fully extended position (e.g., along a curved path). This example includes an anti-lock link captured between the spine and the hinge arm to move along a path. Rotation of the hinge arm to the fully extended position is configured to rotate the anti-lock link along the path and partially out of the spine until the anti-lock link contacts the spine and blocks further extension of the hinge arm. Reverse rotation of the hinge arm from the fully extended position toward the retracted position is configured to initially cause the hinge arm to contact the anti-lock link and not the outer arced surface. After the initial rotation out of the fully extended position, the anti-lock link is configured to allow the hinge arm to contact the outer arced surface.

This summary is included to provide a brief explanation of some of the concepts described in this patent and is not intended as a complete or limiting description.

DESCRIPTION

The present concepts relate to devices, such as computing devices that include first and second device portions that are coupled at a hinge assembly through a range of (angular)

rotation, such as from a closed zero-degree orientation (e.g., extended position) to a fully open orientation (e.g., retracted position), such as 180 degrees. A flexible display can span across the hinge assembly and be secured to both the first and second portions. The present concepts provide technical solutions that provide proper hinge function and display support while reducing device real-estate occupied by the hinge assembly. The technical solutions include a hinge design that provides space for the flexible display when the device is closed. Previous hinge designs suffer from binding or locking when the device is closed and then an attempt is made to re-open the device. This problem is especially pronounced with thin devices (in the z reference direction of FIG. 1A). The present technical solutions also solve this binding problem, even when the device is very thin.

Figure 1A:
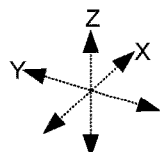
FIGS. 1A and 4A show perspective views of example devices in accordance with some implementations of the present concepts.
Figure 1B:
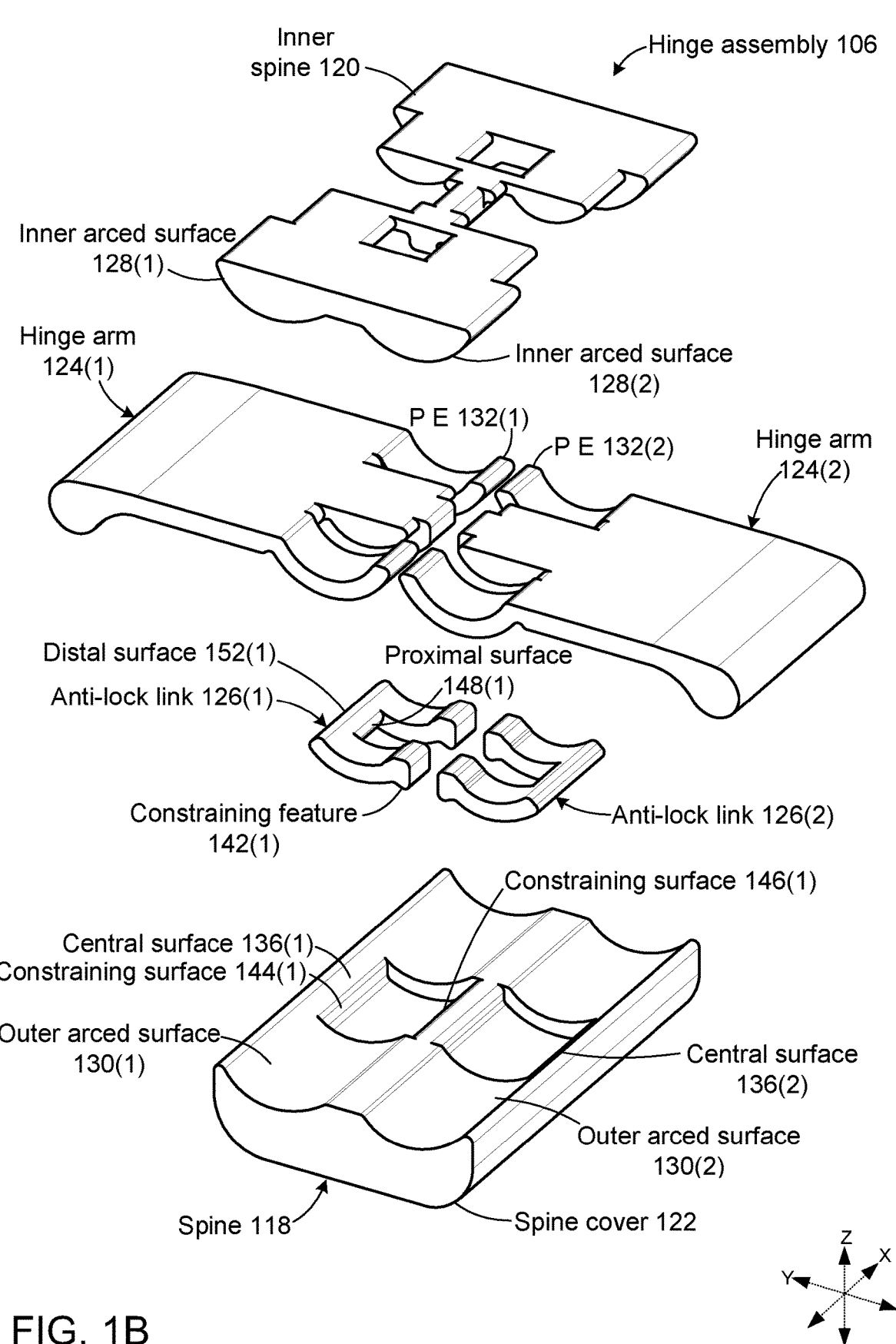
FIGS. 1B, 1C, 4B, and 4C show exploded perspective views of example devices in accordance with some implementations of the present concepts.
Figure 1C:
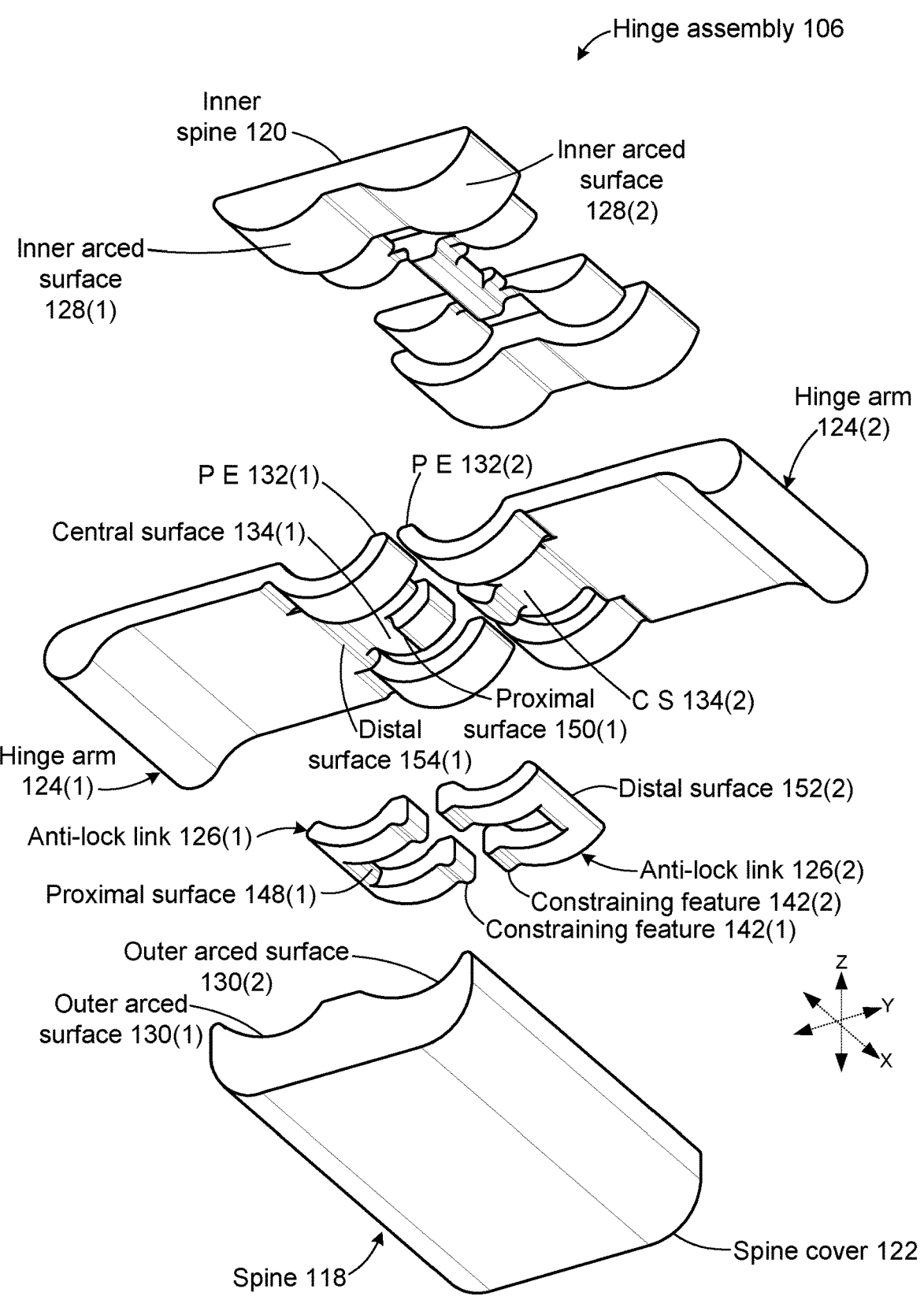

Introductory FIGS. 1A-1C show an example device 100 that has first and second portions 102 and 104 that are rotatably secured together by a hinge assembly 106. FIG. 1A shows the first and second portions and the hinge assembly at a 180-degree orientation. In this implementation, 180 degrees is a fully open orientation. The hinge assembly 106 is shown in ghost in FIG. 1A to indicate that it would not normally be visible because it is obstructed by other components. Note that to avoid clutter on the drawing page, not every instance of each element is specifically labeled in each FIG.

In the illustrated implementation, a flexible display 108 is positioned on a first or upper major surface 110 of the first portion 102 across the hinge assembly 106 and on a first or upper major surface 112 of the second portion 104. Thus, this hinge assembly 106 implementation accommodates a folding display device, such as a folding phone, tablet, or laptop where the flexible display spans two portions that move relative to one another. The hinge assembly provides room for the flexible display to bend in a tear drop shape to avoid damage to the flexible display.

Other hinge assembly 106 implementations may be employed in other form factors. For instance, some of the present hinge assemblies can be employed as a hinge assembly that moveably couples a kickstand to a base portion. These configurations are often employed on tablet type devices where the user can deploy the kickstand flat against the device in a traditional tablet configuration or the user can rotate the kickstand out away from the device to support the device at a desired posture.

In the illustrated implementation, the hinge assembly 106 is positioned at, or close to, the first major surface 110 and the first major surface 112. The hinge assembly 106 extends towards a second or lower major surface 114 of the first portion 102 and a second or lower major surface 116 of the second portion 104 (e.g., between the first and second major surfaces of the first portion and the second portion). The hinge assembly 106 secures the first and second portions 102 and 104 and allows the first and second portions to rotate around hinge axes that are substantially parallel to the x reference axis.

In this case, the hinge assembly 106 includes a spine 118. The spine 118 entails an inner spine 120 and a spine cover 122. The hinge assembly 106 also includes hinge arms 124 and anti-lock links 126 (FIGS. 1B and 1C). Hinge arms 124 extend between the spine 118 and the first and second portions 102 and 104. The hinge arms 124 can be secured to the first and second portions. In alternative configurations, such as a kickstand configuration, the spine 118 can be part of the main body of the device (e.g., part of the tablet housing) while the hinge arm is secured to the kickstand. Other implementations are contemplated.

The spine 118 defines the hinge trajectory or path of the hinge arms 124. In this implementation the inner spine 120 defines inner arced (e.g., convex) surfaces 128 (FIG. 1B) that face opposing outer arced (e.g., concave) surfaces 130 (FIG. 1B) defined by the spine cover 122. The inner arced surfaces 128 and opposing outer arced surfaces 130 collectively define curved paths (arcs) along which proximal ends 132 of the hinge arms 124 travel. (An example path P1 is indicated in FIG. 2A). Similarly, central surfaces 134 of the hinge arms 124 and central surfaces 136 of the spine cover 122 capture and define paths of the anti-lock links 126. (An example path P2 is indicated in FIG. 2A). In this case, the path P2 is an arc, but the path could alternatively be straight or another shape.

Note that in this case, the paths of the hinge arms 124 and the anti-lock links 126 are controlled from their major surfaces and not along their edges. Further, hinge arms 124 and the anti-lock links 126 directly interact with one another (e.g., without an intermediary link interposed between them). Further still, the present hinge assembly 106 maintains contact between the inner and outer links (e.g., the hinge arms 124 and the anti-lock links 126) for the majority of the motion of the hinge. This means that free play and tolerance are reduced for the same clearances, compared to a traditional multistage hinge that includes an intermediary link.

The traditional multistage hinge has two stacked moving interfaces (e.g., one between the outer link and the intermediary link and one between the intermediary link and the inner link). In contrast, the present hinge assembly concepts employ the anti-lock links 126 to provide an anti-lock function. In the current 'anti-lock hinge' for the majority of the motion there is only one moving interface (e.g., between the hinge arms 124 and the anti-lock links 126). Thus, technical advantages of the present anti-lock hinge concepts include improving tolerance and free play at a given cost point, as well as potentially reducing hinge assembly cost.

An extent of the range of the path of the anti-lock links 126 (e.g., in degrees) is defined by the constraining features 142 of the anti-lock links 126 engaging opposing constraining surfaces 144 and 146 of the spine cover 122. Within this range of rotation, the anti-lock links 126 are free ranging unless acted upon by the hinge arms 124. Specifically, when the hinge arms 124 are rotating from a retracted position to an extended position, proximal surfaces 148 of the anti-lock links 126 can be contacted by and moved by, proximal surfaces 150 of the hinge arms 124. When the hinge arms are rotating from an extended position to a retracted position, distal surfaces 152 of the anti-lock links 126 can be contacted by and moved by, distal surfaces 154 of the hinge arms 124. The above aspects are illustrated and discussed below relative to FIGS. 2A, 2B, and 3A-3E.

In the illustrated implementation, the anti-lock links 126 have a squared U-shape. An open end of the U-shape is positioned proximally (e.g., toward the center of the spine 118) and a closed end of the U-shape is positioned distally (e.g., away from the center of the spine 118). The proximal surfaces 148 and distal surface 152 are on opposing sides of the closed end and are oriented parallel to a long axis of the spine 118. Other anti-lock link shapes are contemplated, such as a T-shape, curved U-shape, or an I-shape, among others.

FIGS. 2A and 2B show the hinge assembly 106 at three representative positions including a fully retracted position of the hinge arms 124 at the top of the drawing page of FIG. 2A. After rotation of the hinge arms 124 from the fully retracted position toward the extended position indicated at

202, an intermediate position is shown in the middle of the drawing page. An extended position is shown at the bottom of the drawing page of FIG. 2A where the hinge arms 124 approach a fully extended position.

As shown in FIG. 2A, starting with the fully retracted position at the top of the drawing page, the hinge arms 124 can be rotated upwardly. At this point, the hinge arms 124 are not engaging the anti-lock links 126. As such, the positions of the anti-lock links 126 are self-determinative (e.g., free).

At the intermediate position, the upward movement of the hinge arms 124 causes the proximal ends 132 of the hinge arms to move along path P1. The proximal ends 132 engage and rotate the anti-lock links 126. Specifically, the proximal surfaces 150 of the hinge arms are engaging the proximal surfaces 148 of the anti-lock links 126. Continued upward rotation of the hinge arms 124 is moving the anti-lock links 126 along path P2.

The bottom illustrated position on the drawing page of FIG. 2A shows the hinge arms 124 approaching the fully extended position. Compared to the intermediate position, the hinge arms have continued to move along path P1 and caused anti-lock links 126 to move along path P2. Rotation of the anti-lock links 126 will stop when constraining features 142 of the anti-lock links 126 contact constraining surfaces 144 of the spine cover 122. Because of the engagement of the anti-lock links 126 with the hinge arms 124 (e.g., the proximal surfaces 148 and 150), stopping movement of the anti-lock links 126 will stop further rotation of the hinge arms and thus define the fully extended position. Thus, the anti-lock links 126 provide a technical solution of acting as range limiters for the hinge arms at the fully extended position. Further, the anti-lock links provide another technical solution by preventing unintended binding and/or locking of the hinge arms when rotation is reversed as is described below relative to FIG. 2B. Thus, the anti-lock links 126 provide two technical solutions: they function as range limiters for the hinge arms; and they prevent locking of the hinge arms when rotation is reversed at or near the fully extended position.

FIG. 2B shows the hinge arms 124 at the nearly fully extended position. At this point, rotation of the hinge arms is initiated from the (fully) extended position back toward the retracted position. The anti-lock links 126 receive pressure (e.g., contact forces) from the hinge arms 124 that would otherwise be transferred to the outer arced surface 130 of the spine 118 and could prevent rotation (e.g., lock the hinge arms). This aspect is illustrated and explained relative to region 206. Stated another way, when the hinge arms are oriented at, or close to, such as within 30 degrees of, the fully extended position and a force is applied to initiate rotation of the hinge arms toward a retracted position, the anti-lock links 126 function to reduce and/or eliminate contact forces between the hinge arms 124 and the outer arced surfaces 130 of the spine 118. In some implementations, the anti-lock links 126 eliminate contact between the hinge arms and the outer arced surfaces 130 at this point of initial rotation. In other implementations, contact may still occur, but the contact force and friction between the outer surfaces of the hinge arms and the spine is reduced by the presence of the anti-lock links 126 to an extent that lock up is eliminated.

Region 206 relates to a portion of the spine 118, hinge arm 124(1), and anti-lock link 126(1). As such, rotation of the hinge arm 124(1) from the retracted position toward the extended position is clockwise rotation and rotation of the hinge arm 124(1) from the extended position toward the retracted position is counterclockwise rotation. Region 206 is shown enlarged at enlarged regions 208 and 210. However, in the enlarged region 208, the anti-lock link 126 has been removed for purposes of explanation. Enlarged region 210 includes the anti-lock link 126 and is identical to region 206.

In enlarged region 208, lacking anti-lock link 126, initial rotation toward the retracted position (e.g., counterclockwise) causes contact between the hinge arms 124 and the inner arced surfaces 128 at inner contact zones 212 and between the hinge arms 124 and the outer arced surfaces 130 at outer contact zones 214. In the version shown in region 208, the contact zones 212 and 214 are separated by a distance D1 that is less than or equal to a width W of the proximate ends 132 of the hinge arms 124. Further, in this version, the contact zones 212 and 214 are horizontally aligned (e.g., a horizontal axis parallel to the y reference axis passes through both contact zones). In this version shown in region 208, the distance D1 is short enough that any increase in a counterclockwise moment on hinge arm 124(1) would lead to a greater increase in the clockwise counter-moment resulting from static friction at contact zones 212 and 214. This condition implies that no amount of counterclockwise moment applied to hinge arm 124(1) will lead to actuation of the joint (e.g., hinge arm 124(1) and spine 118) without part failure or deformation.

A shorter distance D1 leads to this condition because the mechanical advantage of hinge arm 124(1) on contact zones 212 and 214 is inversely proportional to the distance D1. Stated another way, for the same opening torque, there will be more friction in the hinge assembly when D1 is shorter. And because the friction increases with torque for any distance D1, at some point, if D1 is small enough no amount of torque will move the hinge arm 124(1) unless something deforms or breaks. The present concepts solve these technical problems as will now be explained relative to enlarged region 210.

The enlarged region 210 is equivalent to, but larger than, region 206 and is representative of some of the present concepts. In this case, at initial counterclockwise rotation 204, instead of the hinge arms 124 contacting the outer arced surfaces 130, the hinge arms 124 initially contact the anti-lock links 126. In this configuration, the inner contact zones 212 are generally unchanged from enlarged regions 208. However, outer contact zones 214 occur between the hinge arms 124 and the anti-lock links 126. The outer contact zones 214 have shifted upwards and away from the inner contact zones 212. This is reflected in that a horizontal line does not pass through both the inner contact zones 212 and the outer contact zones 214. Further, the distance D2 between the contact zones is greater than distance D1 shown in region 208. In the illustrated implementation, distance D2 is also greater than width W of the proximate ends 132.

The separation and orientation of the contact zones 212 and 214 prevents locking between the hinge arms 124 and the spine 118. This avoids device malfunctioning and/or failure that occurs without the anti-lock links. After an initial sub-range of rotation, such as 10 to 30 degrees, the hinge arms 124 can contact the outer surfaces 130 as the hinge arms continue toward the retracted position. The anti-lock links 126 provide two technical solutions: first they function as rotation limiters for the hinge arms 124; and second, they provide an anti-bind or anti-lock function for the hinge arms.

Figure 3A:
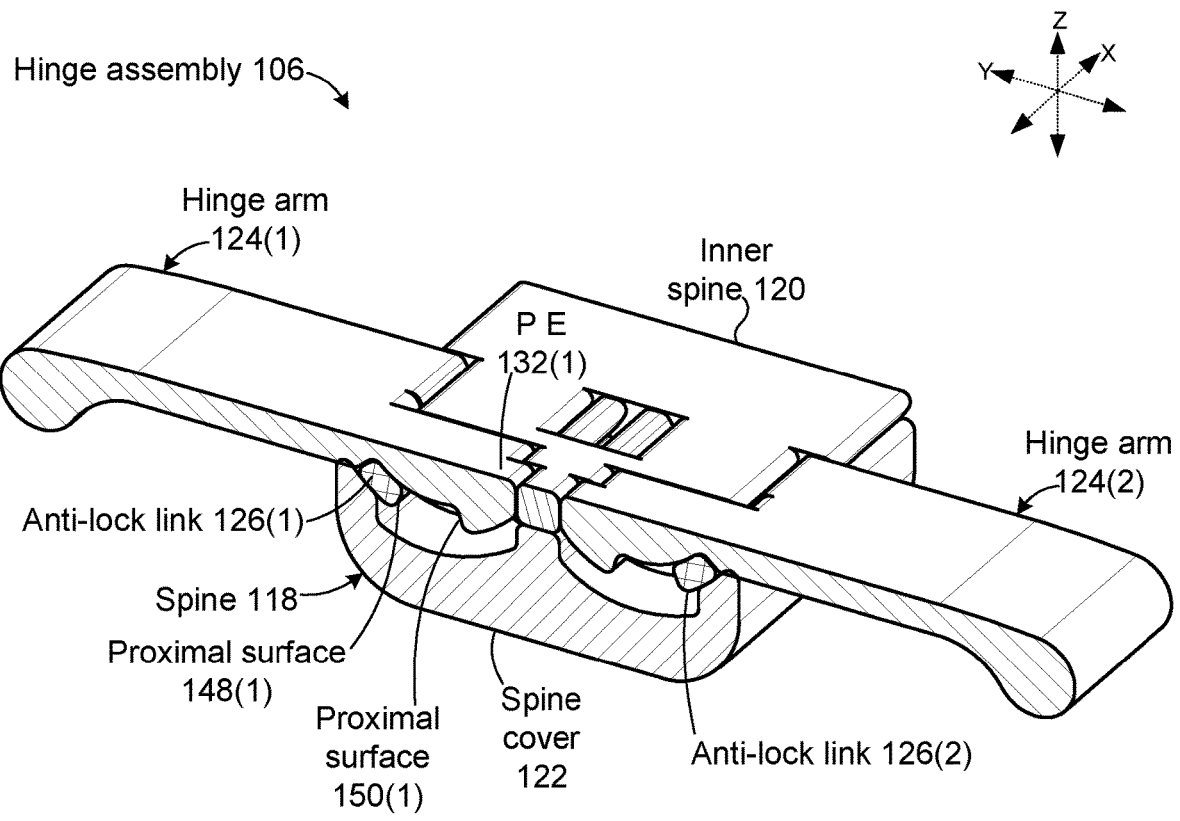
Figure 3B:
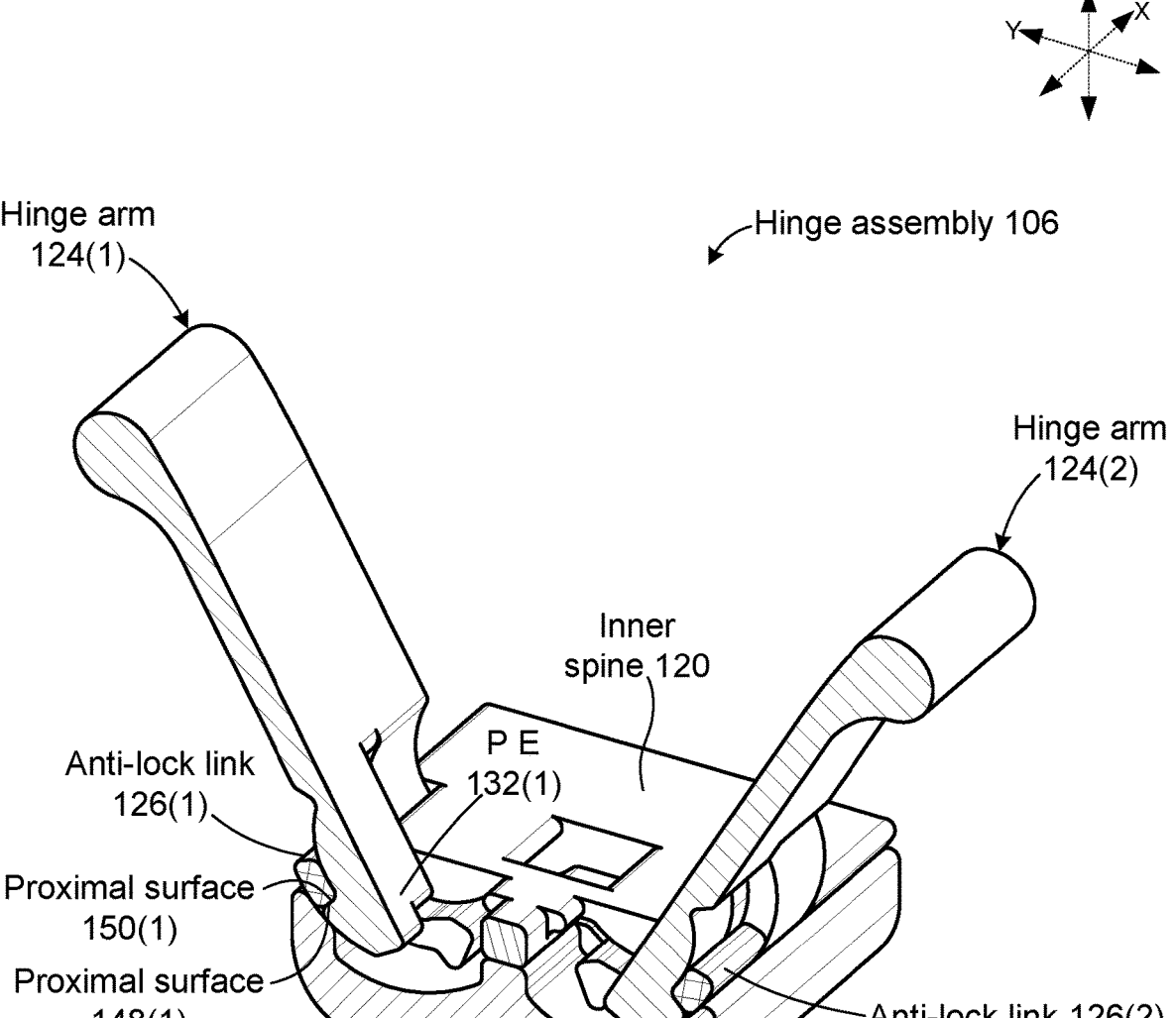
Figure 3C:
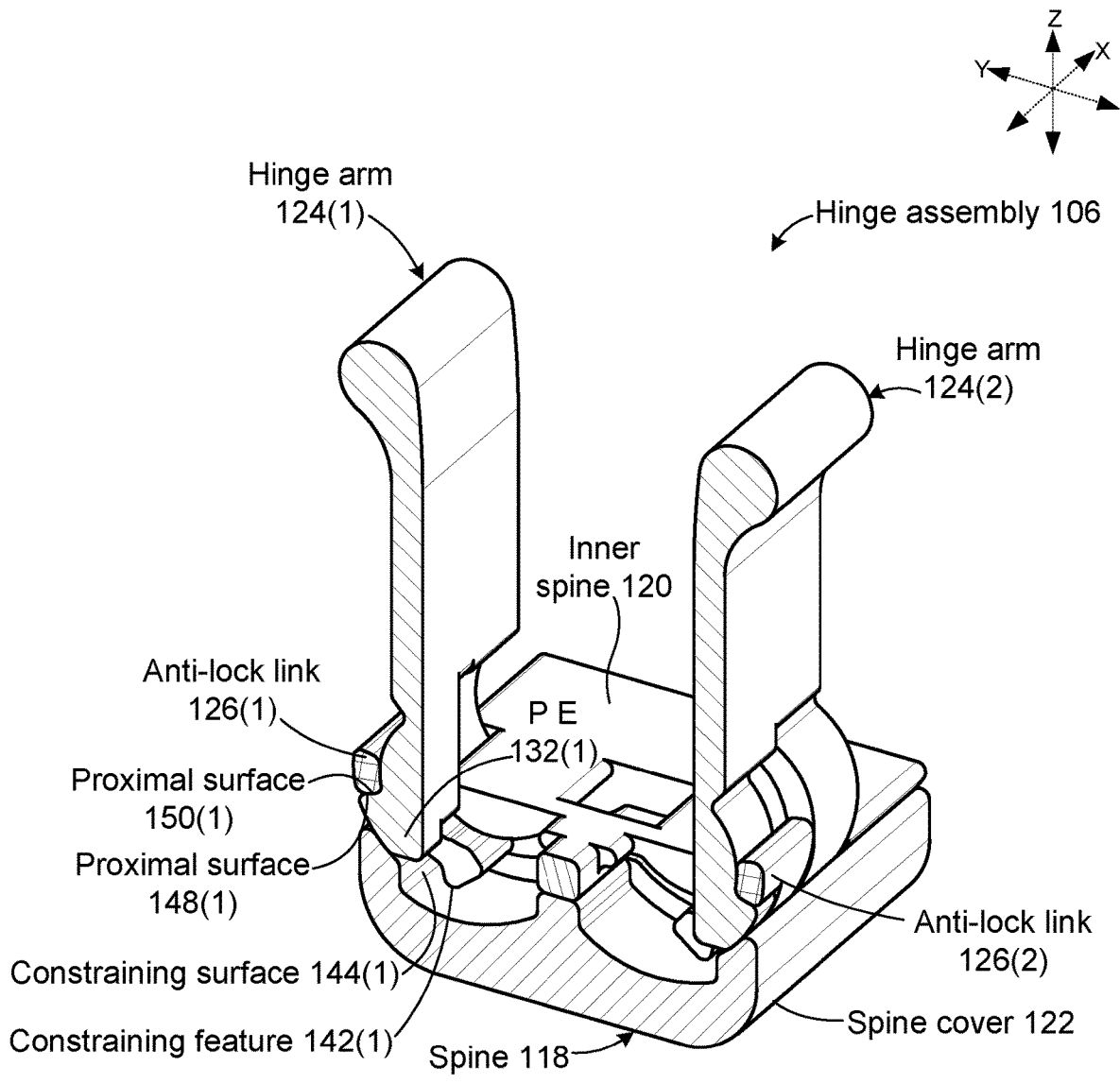
Figure 3D:
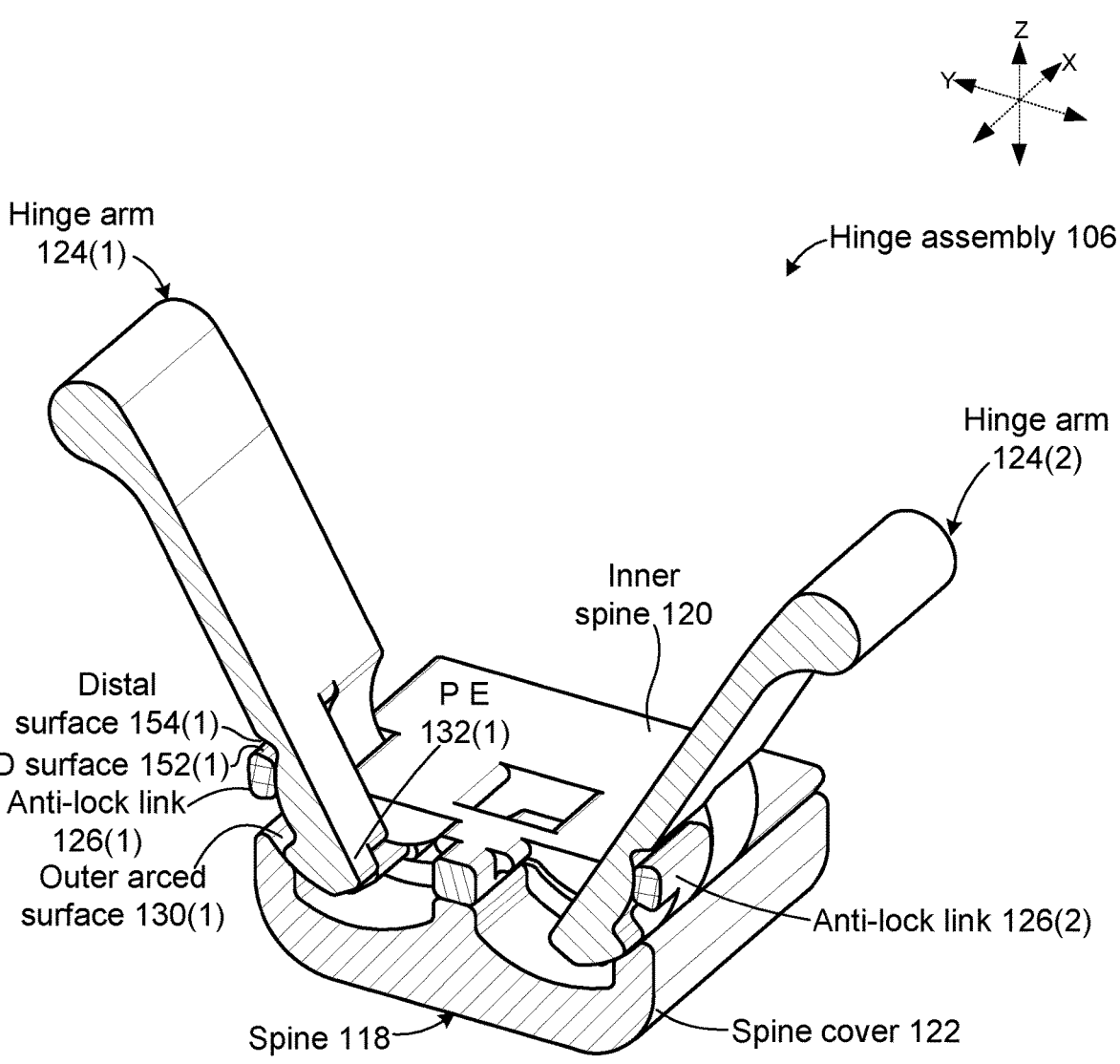
Figure 3E:
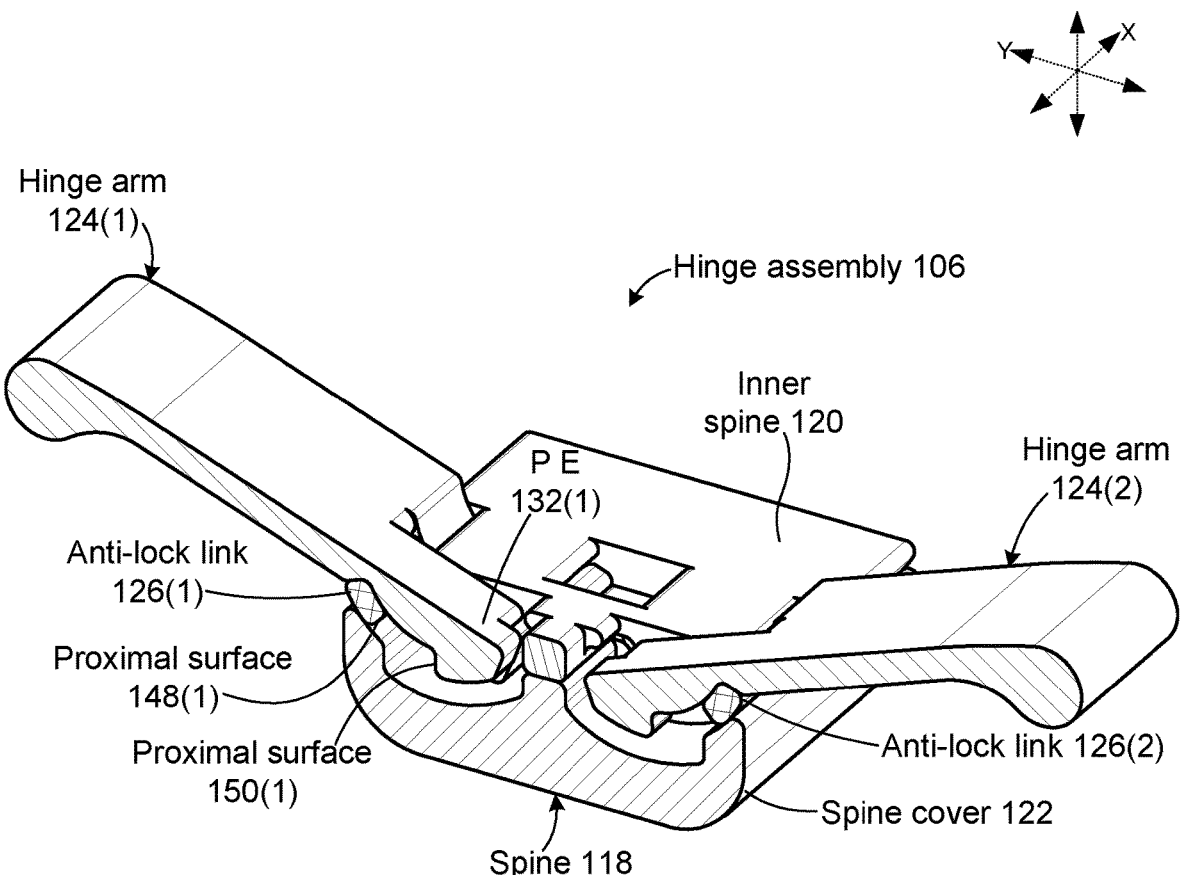
Figure 4A:
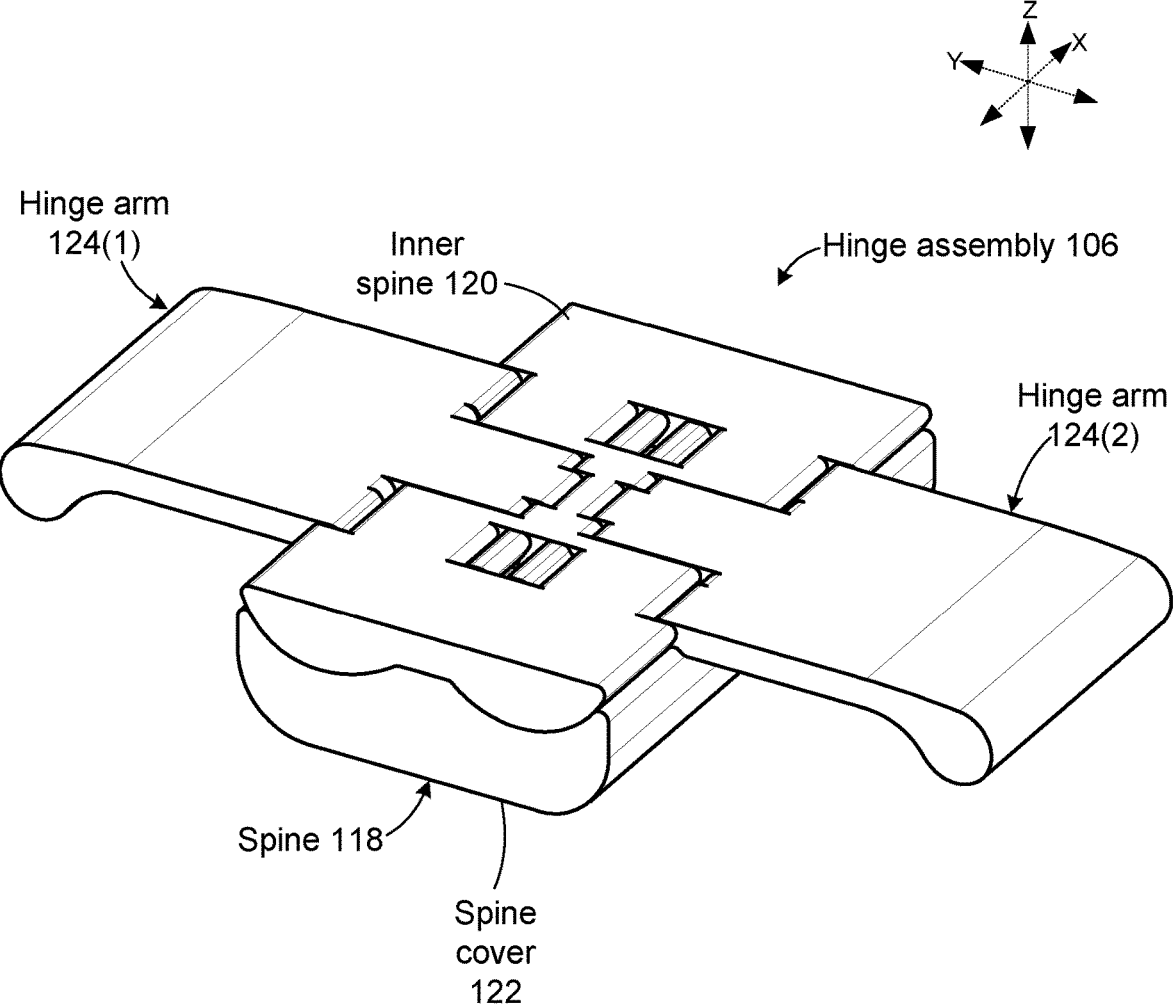
Figure 4B:
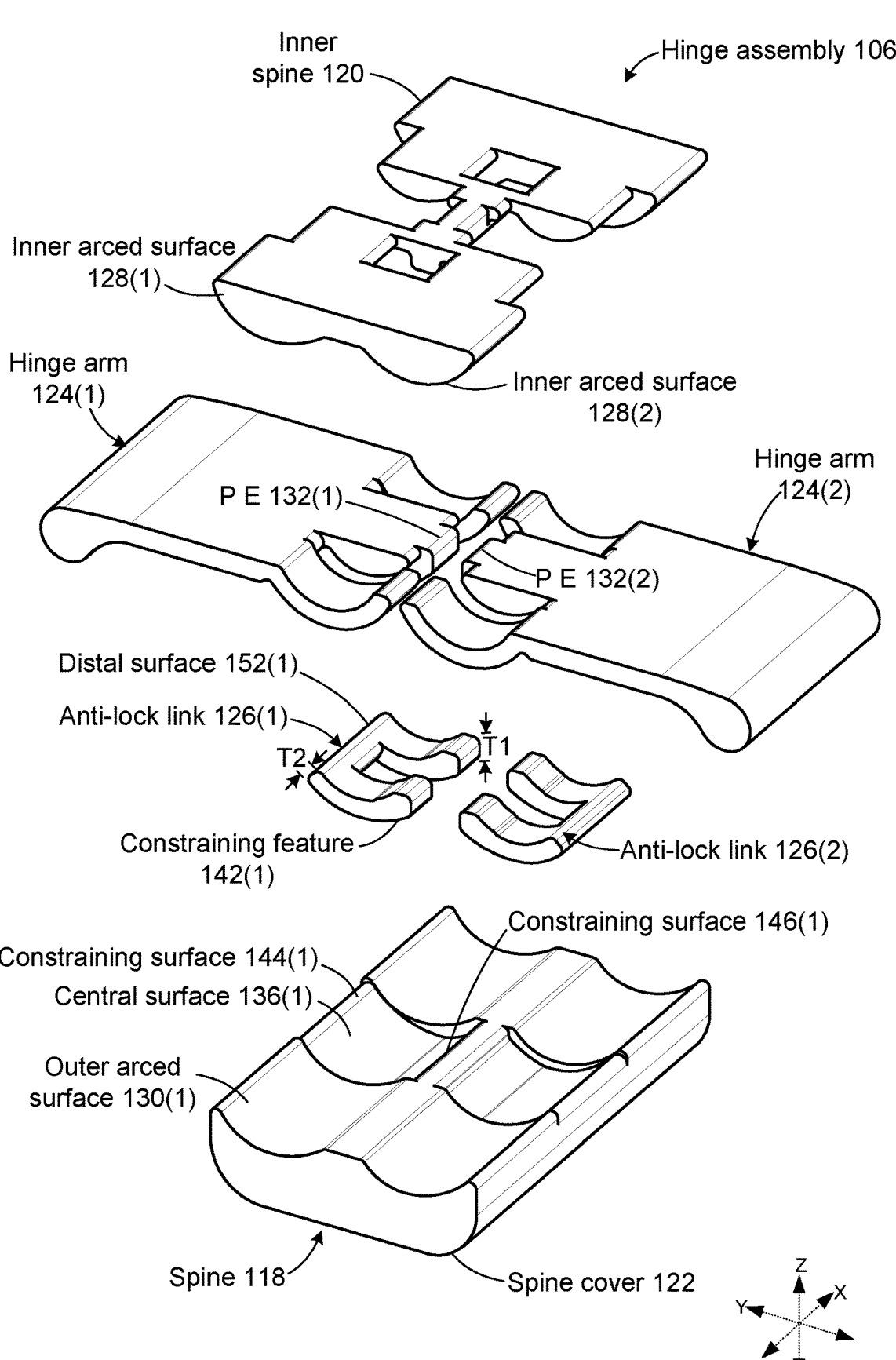
Figure 4C:
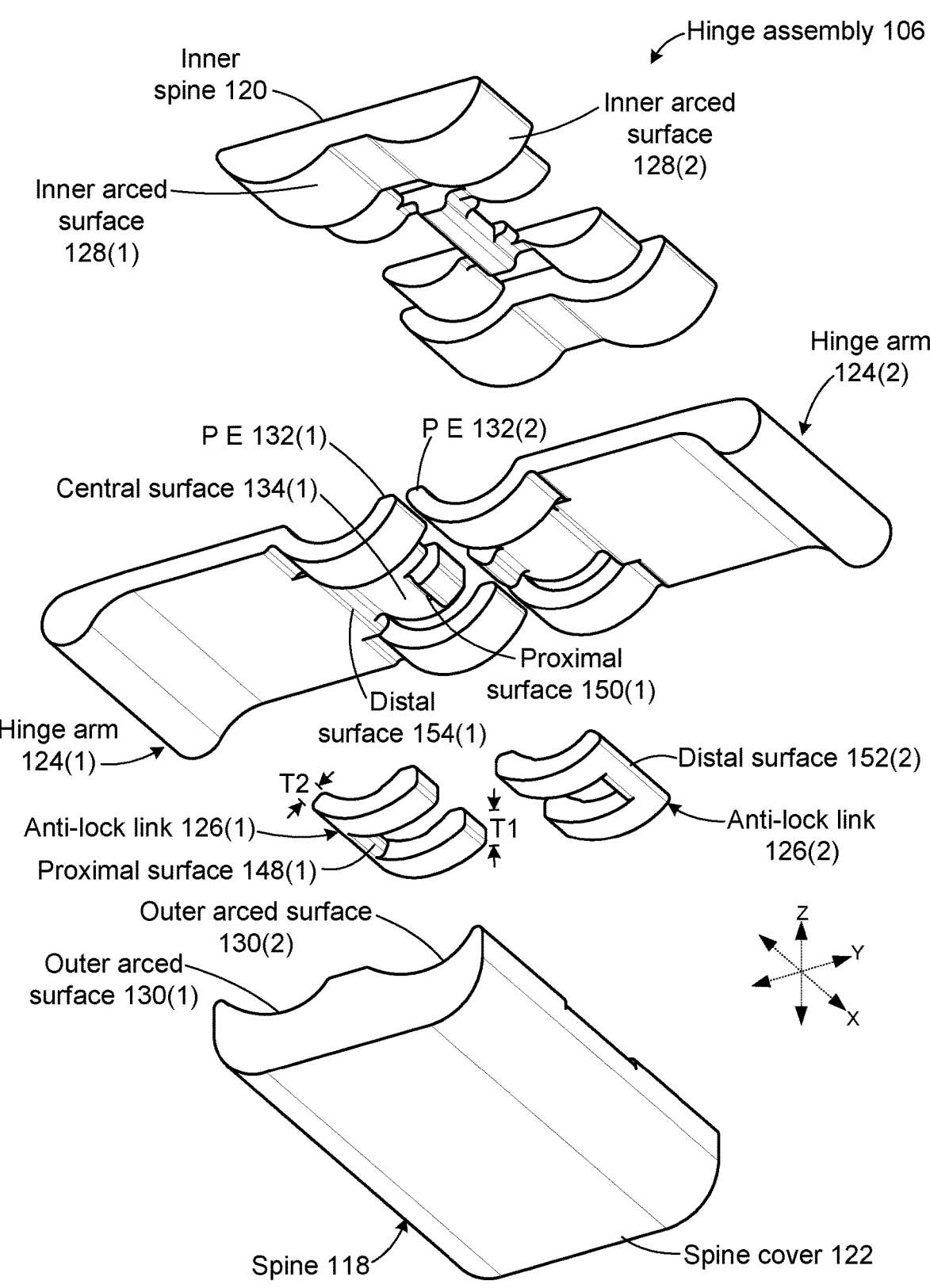

FIGS. 3A-3E collectively illustrate some of the aspects introduced above relative to hinge assembly 106. FIGS. 3A-3E include many of the elements introduced above relative to FIGS. 1A-1C and 2A and 2B, which for the sake of brevity are not re-introduced here. FIG. 3A shows the hinge assembly in a fully retracted position. This can also be considered as a fully open position similar to FIG. 1A where the first portion 102, the hinge assembly 106, and the second portion 104 create a planar surface upon which the flexible display is positioned. FIG. 3A is also similar to the fully retracted position of FIG. 2A. FIG. 3B shows an intermediate position where each of the hinge arms 124 has been rotated about 60 degrees upward. This view is similar to the intermediate position of FIG. 2A. FIG. 3C shows the hinge arms 124 approaching the fully extended position and is similar to the same view in FIG. 2A. FIG. 3D shows the hinge arms 124 rotated in the opposite direction (e.g., increasing retraction) to an intermediate position that is similar to FIG. 3B, but the forces on the hinge arms 124 and the rotation on the hinge arms 124 and the anti-lock links 126 is in the opposite direction compared to FIG. 3B. FIG. 3E shows continued downward rotation of the hinge arms 124 to the fully retracted position that is similar to FIG. 3A. This series of FIGS. shows the interplay between the hinge arms 124, anti-lock links 126, and the spine 118. These aspects are described below.

FIG. 3A shows the hinge arms 124 in the fully retracted position. An upward force applied to the hinge arms 124 can cause the hinge arms to begin rotation without encountering the anti-lock links 126. Specifically, the hinge arms 124 can move freely for a sub-range of rotation until their proximal surfaces 150 contact the proximal surfaces 148 of the anti-lock links. This contact is shown in FIG. 3B.

FIG. 3B shows upward rotation (e.g., extension) of the hinge arms 124. At this point, the hinge arms 124 are contacting the anti-lock links 126. Specifically, the proximal surfaces 150 of the hinge arms 124 are contacting the proximal surfaces 148 of the anti-lock links 126. This contact causes the anti-lock links 126 to move with the hinge arms 124.

FIG. 3C shows the hinge arms 124 approaching the fully extended position. The hinge arms 124 moved the anti-lock links 126 with them. Rotation of the anti-lock links 126 stops when the constraining features 142 of the anti-lock links 126 contacts the constraining surfaces 144 of the spine 118. The anti-lock links 126 will in turn stop further rotation (e.g., extension) of the hinge arms 124.

FIG. 3D shows approximately 20 degrees of initial reverse rotation of the hinge arms 124 toward the retracted position. As described above relative to FIG. 2B, the outer edges of the proximal ends 132 of the hinge arms 124 contact the anti-lock links 126 rather than the outer arced surfaces 130 of the spine 118. Stated another way, the anti-lock links 126 function to reduce contact forces and associated static friction between the hinge arms 124 and the spine 118. Thus, the anti-lock links 126 provide a technical solution that solves the problem of hinge lock that would otherwise occur at the fully extended position when rotation of the hinge arms is initially attempted toward the retracted position.

Movement of the anti-lock links 126 is not tied to the hinge arms 124 until the distal surfaces 154 of the hinge arms 124 engage the distal surfaces 152 of the anti-lock links 126. From that point, the position of the hinge arms 124 controls the position of the anti-lock links 126 as rotation continues in the retracted direction as shown in FIG. 3E. Thus, this configuration of the engagement of anti-lock links 126 and the hinge arms 124 ensures that the anti-lock links 126 are properly positioned when the hinge arms are fully extended to prevent hinge lock, but the movement of the anti-lock links 126 and hinge arms 124 are not tied together through the whole range of rotation. Instead, the anti-lock links 126 are in place to reduce binding between the hinge arms and spine at initial rotation at the fully extended position but allow contact between the hinge arms 124 and spine 118 at other positions where binding is not an issue.

The free range of rotation of the anti-lock links 126 occurs because the distances between the proximal surfaces 150 and distal surfaces 154 of the hinge arms 124 is greater than the distances between the proximal surfaces 148 and distal surfaces 152 of the anti-lock links 126. Thus, free range of rotation of the anti-lock links 126 is defined at least in part by the extent (e.g., delta) between these distances.

FIGS. 4A-6F collectively show another example hinge assembly 106. This implementation includes many of the same elements described above. As such, these elements will not be re-introduced here for sake of brevity.

In this implementation, the constraining features 142 of the anti-lock links 126 entail a tapered shape when viewed in the yz reference plane. The tapered shape is evidenced by a thickness T1 of the proximal end of the anti-lock links 126 being greater than a thickness T2 of the distal ends of the anti-lock links 126. These thicknesses are labeled on FIGS. 4B and 4C.

As can be seen in FIG. 5, the constraining features 142 function in concert with the central surfaces 134 and 136 of the spine 118. The central surfaces 134 and 136 are separated by a distance that gets smaller towards the distal edges (e.g., tapers) in the y reference direction. As the hinge arms 124 are rotated from the fully retracted position, they contact the anti-lock links 126 at an intermediate position. As rotation continues, the anti-lock links 126 are moved with the hinge arms 124 until the wide (e.g., proximate) ends reach a point where the thickness T2 (e.g., outer dimension) of the proximate ends of the anti-lock links contact one or both of the central surfaces 134 and 136. This contact will stop further movement of the anti-lock links 126 and the hinge arms 124. This contact is just beginning to occur as the hinge arms approach the fully extended position as shown at the bottom of FIG. 5. Recall that at this point, the proximal surfaces 148 of the anti-lock links 126 are contacting and being moved by the proximal surfaces 150 of the hinge arms 124. Thus, stopping further movement of the anti-lock links 126 causes the anti-lock links 126 to stop further movement of the hinge arms 124.

Figure 6B:
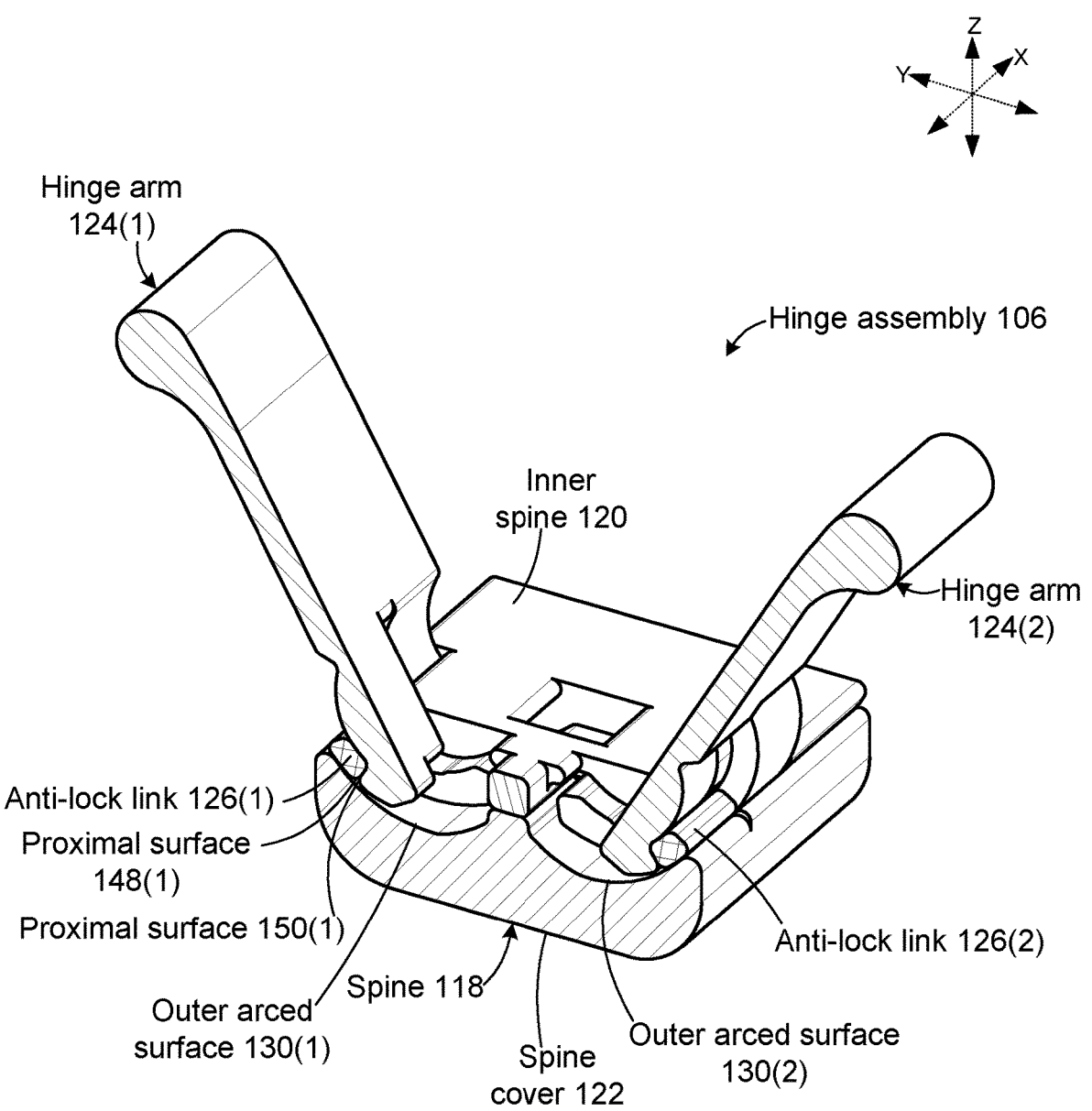
Figure 6C:
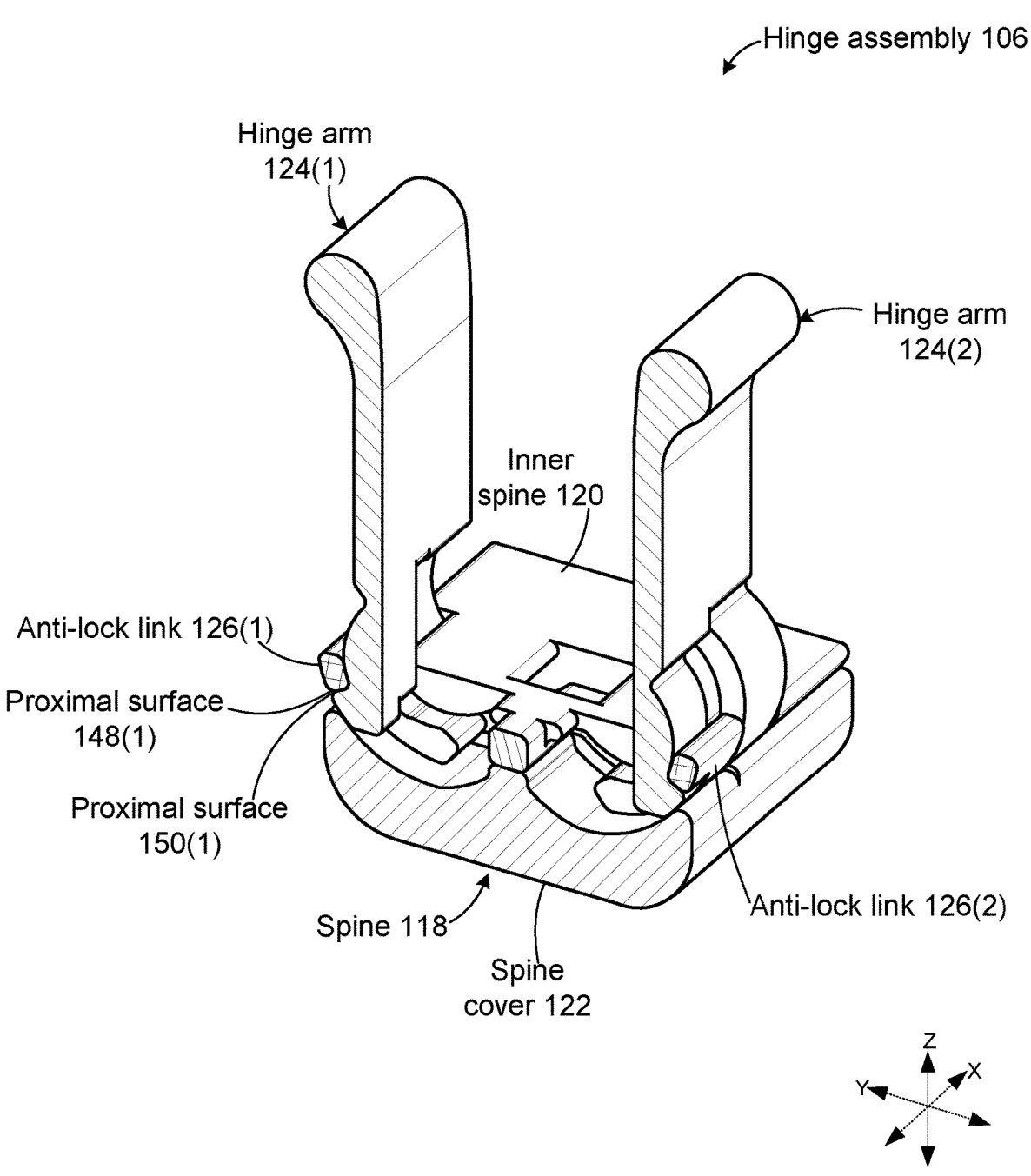

FIGS. 6A-6C show the hinge arms rotating from a fully retracted position to a fully extended position where further rotation is blocked by the constraining features 142. Upon reverse rotation, which occurs between FIG. 6C and FIG. 6D, the hinge arms 124 contact the anti-lock links 126 rather than the spine cover 122 for a first sub-range of rotation. This contact with the anti-lock links 126 decreases and/or eliminates contact forces and associated friction between the hinge arms 124 and the spine 118. As such, the anti-lock links 126 provide a technical solution that prevents lock up of the hinge assembly that would otherwise occur at initial rotation between the proximate ends 132 of the hinge arms 124 and the spine 118. In some implementations, this technical solution can entail the anti-lock links 126 preventing contact between the outer surfaces of the hinge arms and the spine. In other implementations, contact may still occur, but the contact force and friction between the outer surfaces of the hinge arms and the spine is reduced by the presence of the anti-lock links 126 to an extent that lock up is eliminated.

Figure 6E:
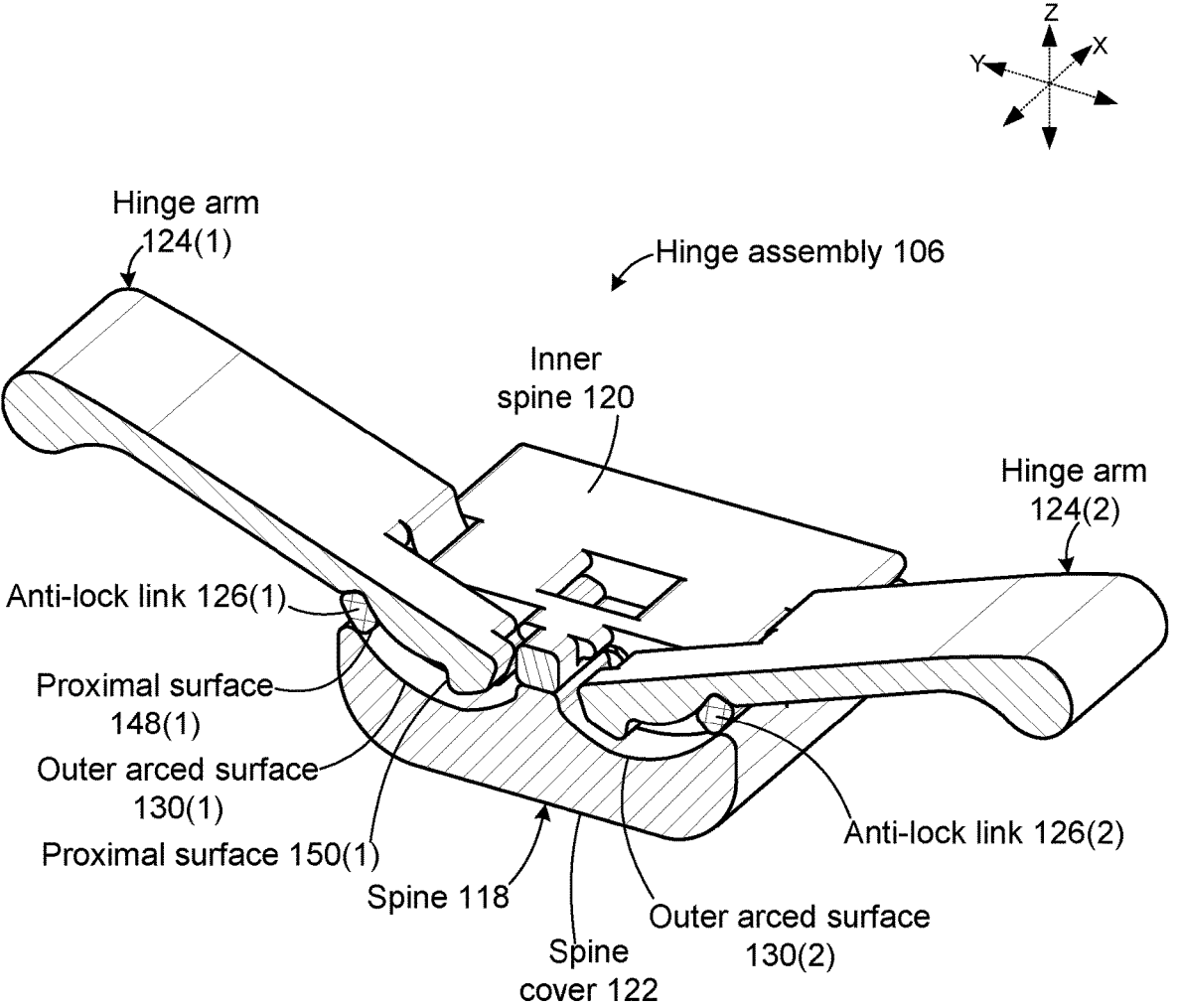
Figure 6F:
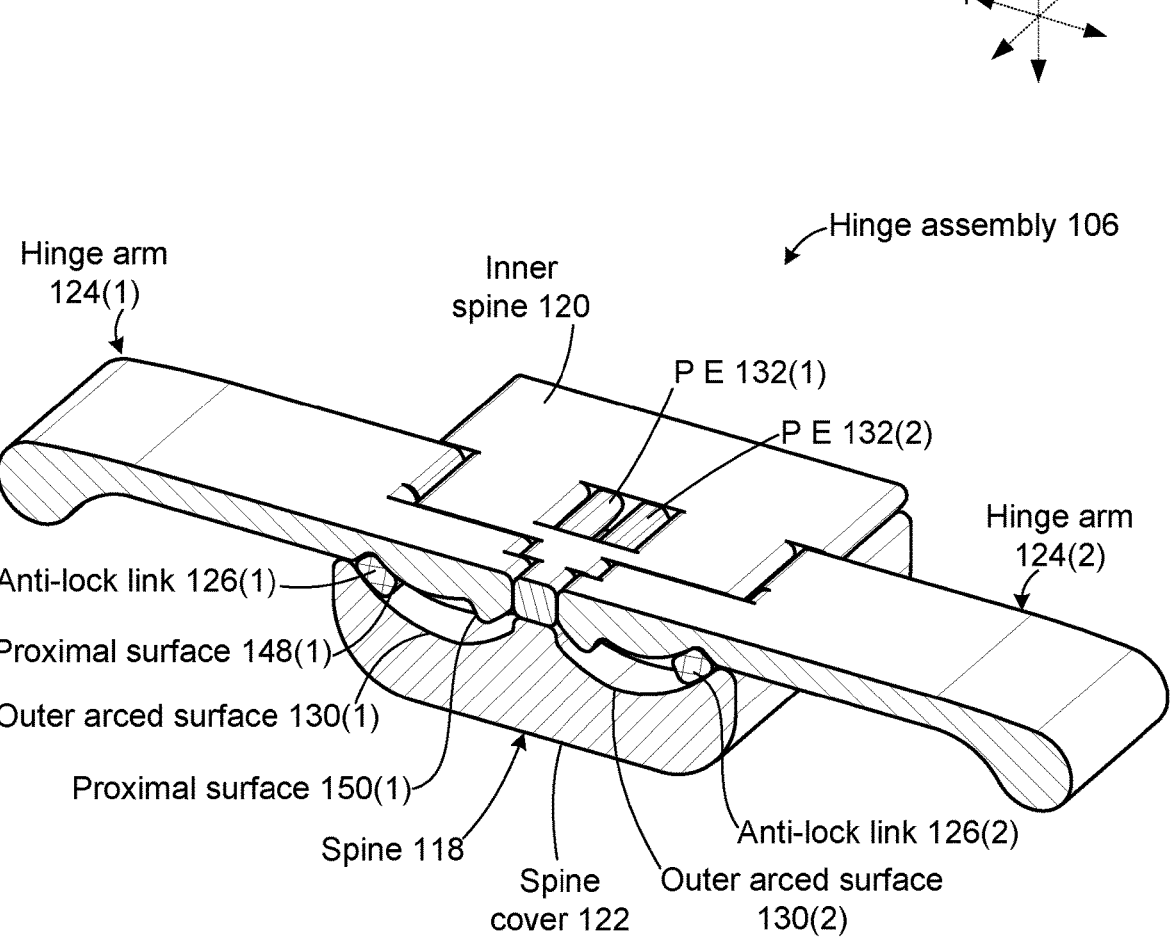

FIG. 6E shows a subsequent point in the rotation of the hinge arms 124 as they retract. At this point, hinge arm locking is not a problematic issue and the hinge arms 124 can contact the spine 118 without concern for device function and integrity as the hinge arms continue through a second sub-range of rotation to the fully retracted position of FIG. 6F. Thus, the anti-lock links 126 provide a technical solution that decreases the likelihood of hinge arm locking at rotational angles where it is prevalent and allows normal function at other orientations. The hinge assembly 106 accomplishes this functionality by controlling the major surfaces of the hinge arms and does not need to enclose the edges of the hinge arms and/or include an intermediate link between the hinge arms and the anti-lock links. The present concepts thus have fewer interfaces and thus less free play than designs employing an intermediary link.

Individual elements of the devices 100 and the hinge assemblies 106 can be made from various materials, such as metals, plastics, foams, polymers, and/or composites. These materials can be prepared in various ways, such as from sheet metals, die cast metals, machined metals, metal injection moldings, 3D printed materials, molded or 3D printed plastics, and/or molded or 3D printed composites, among others, or any combination of these (and/or other) materials and/or preparations can be employed.

The present hinge assembly concepts can be utilized with any type of device, such as but not limited to, notebook computers, smart phones, wearable smart devices, tablets, and/or other types of existing, developing, and/or yet to be developed devices.

Various methods of manufacture, assembly, and/or use for hinge assemblies and devices are contemplated beyond those shown above relative to FIGS. 1A-6F.

Various examples are described above. Additional examples are described below. One example includes a device comprising a spine defining inner and outer arced surfaces, a hinge arm positioned between the inner and outer arced surfaces and configured to arcuately move from a retracted position to a fully extended position and an anti-lock link captured between the spine and the hinge arm to move along an arc, and rotation of the hinge arm to the fully extended position is configured to rotate the anti-lock link along the arc and partially out of the spine and reverse rotation of the hinge arm from the fully extended position is configured for a first sub-range of movement to cause the hinge arm to contact the anti-lock link and not the outer arced surface and for a second sub-range of movement to allow the hinge arm to contact the outer arced surface.

Another example can include any of the above and/or below examples where the anti-lock link comprises a square U-shape, T-shape, or I-shape.

Another example can include any of the above and/or below examples where the anti-lock link is planar or curved.

Another example can include any of the above and/or below examples where the hinge arm defines a proximal surface and an opposing distal surface.

Another example can include any of the above and/or below examples where the anti-lock link defines a proximal surface that faces the proximal surface of the hinge arm and a distal surface that faces the distal surface of the hinge arm.

Another example can include any of the above and/or below examples where a distance between the proximal surface and the distal surface of the hinge arm is greater than a distance between the proximal surface and the distal surface of the anti-lock link.

Another example can include any of the above and/or below examples where rotation of the hinge arm from the fully retracted position towards the fully extended position is not configured to control the position of the anti-lock link until the proximal surface of the hinge arm contacts the proximal surface of the anti-lock link.

Another example can include any of the above and/or below examples where upon contact between the proximal surfaces, continued extension of the hinge arm is configured to continually move the anti-lock link until reaching the fully extended position of the hinge arm.

Another example can include any of the above and/or below examples where at the fully extended position of the hinge arm, retraction of the hinge arm through the first sub-range of rotation is not configured to move the anti-lock link until the distal surface of the hinge arm contacts the distal surface of the anti-lock link.

Another example can include any of the above and/or below examples where the second sub-range of rotation extends to the fully retracted position of the hinge arm.

Another example can include any of the above and/or below examples where the anti-lock link is configured to function as a rotation limiter for the hinge arm that defines the fully extended position.

Another example can include any of the above and/or below examples where the anti-lock link comprises a constraining feature that is configured to engage the spine to stop further extension of the hinge arm and function as the rotation limiter.

Another example can include any of the above and/or below examples where the spine is secured to a housing that includes a display and the hinge arm is secured to a kickstand that is configured to support the housing in various postures.

Another example can include any of the above and/or below examples where the device further comprises a second hinge arm positioned between second inner and outer arced surfaces and configured to arcuately move from a retracted position to a fully extended position, and a second anti-lock link captured between the spine and the second hinge arm to move along an arc, and rotation of the second hinge arm to the fully extended position is configured to rotate the second anti-lock link along the arc and partially out of the spine and reverse rotation of the second hinge arm from the fully extended position is configured for a first sub-range of movement to cause the second hinge arm to contact the second anti-lock link and not the outer arced surface and for a second sub-range of movement to allow the second hinge arm to contact the outer arced surface.

Another example can include any of the above and/or below examples where the device further comprises a flexible display extending over the hinge arm across the spine and over the second hinge arm.

Another example can include a device comprising a spine defining inner and outer arced surfaces, a hinge arm positioned between the inner and outer arced surfaces and configured to arcuately move from a retracted position to a fully extended position and an anti-lock link captured between the spine and the hinge arm to move along a path, and rotation of the hinge arm to the fully extended position is configured to rotate the anti-lock link along the path and partially out of the spine until the anti-lock link contacts the spine and blocks further extension of the hinge arm, and reverse rotation of the hinge arm from the fully extended position toward the retracted position is configured to initially cause the hinge arm to contact the anti-lock link and not the outer arced surface and after rotation out of the fully extended position the anti-lock link is configured to allow the hinge arm to contact the outer arced surface.

Another example can include any of the above and/or below examples where the spine comprises an inner spine that defines the inner arced surface and a spine cover that defines the outer arced surface.

Another example can include any of the above and/or below examples where the hinge arm defines a distal surface and a proximal surface that are spaced farther apart than a distal surface and a proximal surface of the anti-lock link.

Another example can include any of the above and/or below examples where the anti-lock link comprises a constraining feature that contacts the spine to block further extension of the hinge arm.

Another example can include a device comprising a spine defining inner and outer arced surfaces, a hinge arm positioned between the inner and outer arced surfaces and configured to arcuately move from a retracted position to a fully extended position and an anti-lock link captured between the spine and the hinge arm to move along a path, and rotation of the hinge arm to the fully extended position is configured to rotate the anti-lock link along the path and partially out of the spine, and reverse rotation of the hinge arm from the fully extended position toward the retracted position is configured to initially cause the hinge arm to contact the anti-lock link to prevent contact forces between the hinge arm and the outer arced surface.

Although techniques, methods, devices, systems, etc., pertaining to hinge assemblies are described in language specific to structural features and/or methodological acts, it is to be understood that the subject matter defined in the appended claims is not limited to the specific features or acts described. Rather, the specific features and acts are disclosed as example forms of implementing the claimed methods, devices, systems, etc.

The invention claimed is:

1. A device, comprising:
a spine defining inner and outer arced surfaces;
a hinge arm positioned between the inner and outer arced surfaces and configured to arcuately move from a fully retracted position to a fully extended position; and,
an anti-lock link captured between the spine and the hinge arm to move along an arc, and rotation of the hinge arm to the fully extended position is configured to rotate the anti-lock link along the arc and partially out of the spine and reverse rotation of the hinge arm from the fully extended position is configured for a first sub-range of movement where the anti-lock link is configured to rotate with the hinge arm to cause the hinge arm to contact the anti-lock link and thereby reduce contact forces between the hinge arm and the outer arced surface and for a second sub-range of movement where the anti-lock link is blocked from rotating with the hinge arm to allow increased contact forces between the hinge arm and the outer arced surface.

2. The device of claim 1, wherein the anti-lock link comprises a square U-shape, T-shape, or I-shape.

3. The device of claim 1, wherein the anti-lock link is planar or curved.

4. The device of claim 1, wherein the hinge arm defines a proximal surface and an opposing distal surface.

5. The device of claim 4, wherein the anti-lock link defines a proximal surface that faces the proximal surface of the hinge arm and a distal surface that faces the distal surface of the hinge arm.

6. The device of claim 5, wherein a distance between the proximal surface and the distal surface of the hinge arm is greater than a distance between the proximal surface and the distal surface of the anti-lock link.

7. The device of claim 6, wherein rotation of the hinge arm from the fully retracted position towards the fully extended position is not configured to control the position of the anti-lock link until the proximal surface of the hinge arm contacts the proximal surface of the anti-lock link.

8. The device of claim 7, wherein upon contact between the proximal surfaces, continued extension of the hinge arm is configured to continually move the anti-lock link until reaching the fully extended position of the hinge arm.

9. The device of claim 8, wherein at the fully extended position of the hinge arm, retraction of the hinge arm through the first sub-range of rotation is not configured to move the anti-lock link until the distal surface of the hinge arm contacts the distal surface of the anti-lock link.

10. The device of claim 9, wherein the second sub-range of rotation extends to the fully retracted position of the hinge arm.

11. The device of claim 10, wherein the anti-lock link is configured to function as a rotation limiter for the hinge arm that defines the fully extended position.

12. The device of claim 11, wherein the anti-lock link comprises a constraining feature that is configured to engage the spine to stop further extension of the hinge arm and function as the rotation limiter.

13. The device of claim 1, wherein the spine is secured to a housing that includes a display and the hinge arm is secured to a kickstand that is configured to support the housing in various postures.

14. The device of claim 1, further comprising a second hinge arm positioned between second inner and outer arced surfaces and configured to arcuately move from a fully retracted position to a fully extended ed position, and a second anti-lock link captured between the spine and the second hinge arm to move along an arc, and rotation of the second hinge arm to the fully extended position is configured to rotate the second anti-lock link along the arc and partially out of the spine and reverse rotation of the second hinge arm from the fully extended position is configured for the first sub-range of movement to cause the second hinge arm to contact the second anti-lock link and not the outer arced surface and for the second sub-range of movement to allow the second hinge arm to contact the outer arced surface.

15. The device of claim 14, further comprising a flexible display extending over the hinge arm across the spine and over the second hinge arm.

16. A device, comprising:
a spine defining inner and outer arced surfaces;
a hinge arm positioned between the inner and outer arced surfaces and configured to arcuately move from a retracted position to a fully extended position; and,
an anti-lock link captured between the spine and the hinge arm to move along a path, and rotation of the hinge arm to the fully extended position is configured to rotate the anti-lock link along the path and partially out of the spine until the anti-lock link contacts the spine and blocks further extension of the hinge arm, and reverse rotation of the hinge arm from the fully extended position toward the retracted position is configured to initially cause the hinge arm to contact the anti-lock link and reduce contact forces with the outer arced surface and after rotation out of the fully extend position the anti-lock link is configured to allow higher contact forces from the hinge arm to the outer arced surface.

17. The device of claim 16, wherein the spine comprises an inner spine that defines the inner arced surface and a spine cover that de-fines the outer arced surface.

18. The device of claim 17, wherein the hinge arm defines a distal surface and a proximal surface that are spaced farther apart than a distal surface and a proximal surface of the anti-lock link.

19. The device of claim 18, wherein the anti-lock link comprises a constraining feature that contacts the spine to block further extension of the hinge arm.

20. A device, comprising:
a spine defining inner and outer arced surfaces;
a hinge arm positioned between the inner and outer arced surfaces and configured to arcuately move from a retracted position to a fully extended position; and,
an anti-lock link captured between the spine and the hinge arm to move along a path, and rotation of the hinge arm to the fully extended position is configured to rotate the anti-lock link along the path and partially out of the spine, and reverse rotation of the hinge arm from the fully extended position toward the retracted position is configured to initially cause the hinge arm to impart contact forces on the anti-lock link to reduce contact forces between the hinge arm and the outer arced surface.

* * * * *